US012787756B2

(12) United States Patent
Saxler

(10) Patent No.: US 12,787,756 B2
(45) Date of Patent: Nov. 3, 2026

(54) MEMORY DEVICES INCLUDING SLOT STRUCTURES

(71) Applicant: Micron Technology, Inc., Boise, ID (US)

(72) Inventor: Adam W. Saxler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 18/677,693

(22) Filed: May 29, 2024

(65) Prior Publication Data

US 2024/0321745 A1 Sep. 26, 2024

Related U.S. Application Data

(63) Continuation of application No. 17/407,449, filed on Aug. 20, 2021, now Pat. No. 12,027,460.

(51) Int. Cl.

| | |
|---|---|
| ***H10W 20/41*** | (2026.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |
| ***H10W 20/00*** | (2026.01) |
| ***H10W 20/42*** | (2026.01) |

(52) U.S. Cl.

CPC .......... *H10W 20/435* (2026.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02); *H10W 20/056* (2026.01); *H10W 20/076* (2026.01); *H10W 20/42* (2026.01); *H10W 20/425* (2026.01)

(58) Field of Classification Search

None

See application file for complete search history.

(56) References Cited

U.S. PATENT DOCUMENTS

| | | | |
|---|---|---|---|
| 9,064,576 B2 | 6/2015 | Tanzawa | |
| 9,941,209 B2 | 4/2018 | Tessariol et al. | |
| 10,141,330 B1 | 11/2018 | Lindsay et al. | |
| 10,269,626 B2 | 4/2019 | Ha et al. | |
| 10,381,080 B2 | 8/2019 | Pan et al. | |
| 10,580,795 B1 | 3/2020 | Luo et al. | |
| 12,027,460 B2 * | 7/2024 | Saxler | H10B 41/10 |
| 2018/0342518 A1 * | 11/2018 | Kim | H10B 12/053 |
| 2021/0050364 A1 * | 2/2021 | Tapias | H10B 41/27 |
| 2023/0018127 A1 | 1/2023 | Gandhi et al. | |

* cited by examiner

*Primary Examiner* — Nduka E Ojeh

(74) *Attorney, Agent, or Firm* — TraskBritt

(57) ABSTRACT

A microelectronic device comprises a stack structure, and slot structures vertically extending through the stack structure and dividing the stack structure into block structures. Each of the slot structures individually comprises an insulative liner material vertically extending through the slot structure and contacting sidewalls of the insulative levels and the conductive levels defining the slot structure, and grains of a material in contact with sidewalls of the insulative liner material. The grains of the material comprise first grains spanning an entire width between the sidewalls of the insulative liner material. Related memory devices, electronic systems, and methods are also described.

19 Claims, 12 Drawing Sheets

MEMORY DEVICES INCLUDING SLOT STRUCTURES

CROSS-REFERENCE TO RELATED APPLICATION

This application is a continuation of U.S. patent application Ser. Ser. No. 17/407,449, filed Aug. 20, 2021, now U.S. Pat. No. 12,027,460, issued Jul. 2, 2024, the disclosure of which is hereby incorporated herein in its entirety by this reference.

TECHNICAL FIELD

The disclosure, in various embodiments, relates generally to the field of microelectronic device design and fabrication. More specifically, the disclosure relates to microelectronic devices and apparatuses including slot structures extending through tiers of alternating conductive structures and insulative structures, the slot structures comprising grains extending across an entire width of the slot structures, and to related memory devices, electronic systems, and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the height of the stacks increases, the tendency of the vertical memory array to exhibit block bending due to different stresses of the materials of the vertical memory array has increased. Block bending may lead to misalignment of conductive components and failure of the vertical memory arrays.

BRIEF DESCRIPTION OF THE DRAWINGS

FIG. 1C, and FIG. 1E through FIG. 1G) and simplified partial top-down views (FIG. 1B, FIG. 1D, FIG. 1H) illustrating a method of forming a microelectronic device structure for a microelectronic device, in accordance with embodiments of the disclosure;

DETAILED DESCRIPTION

Figure 1A:
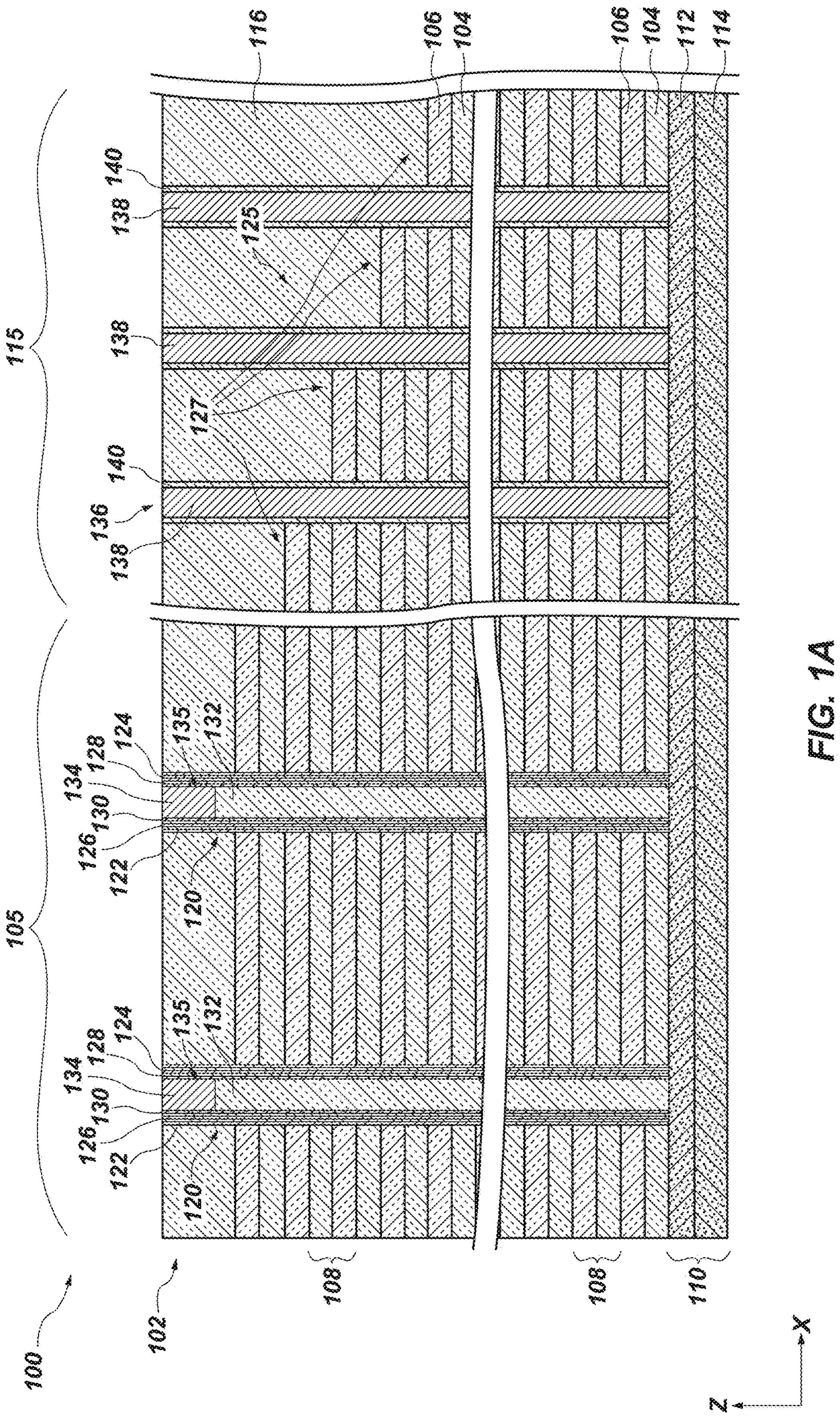
FIG. 1A through FIG. 1H are simplified partial cross-sectional views (FIG. 1A.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, memory device, or electronic system, or a complete microelectronic device, apparatus, memory device, or electronic system including slot structures having grains extending across an entire width thereof. The structures described below do not form a complete microelectronic device, apparatus, memory device, or electronic system. Only those process acts and structures necessary to understand the embodiments described herein are described in detail below. Additional acts to form a complete microelectronic device, apparatus, memory device, or electronic system from the structures may be performed by conventional techniques.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). In some embodiments, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term “configured” refers to a size, shape, material composition, orientation, and arrangement of one or more of at least one structure and at least one apparatus facilitating operation of one or more of the structure and the apparatus in a predetermined way.

As used herein, the terms “longitudinal,” “vertical,” “lateral,” and “horizontal” are in reference to a major plane of a substrate (e.g., base material, base structure, base construction, etc.) in or on which one or more structures and/or features are formed and are not necessarily defined by Earth’s gravitational field. A “lateral” or “horizontal” direction is a direction that is substantially parallel to the major plane of the substrate, while a “longitudinal” or “vertical” direction is a direction that is substantially perpendicular to the major plane of the substrate. The major plane of the substrate is defined by a surface of the substrate having a relatively large area compared to other surfaces of the substrate.

As used herein, the term “substantially” in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, “about” or “approximately” in reference to a numerical value for a particular parameter is inclusive of the numerical value and a degree of variance from the numerical value that one of ordinary skill in the art would understand is within acceptable tolerances for the particular parameter. For example, “about” or “approximately” in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as “beneath,” “below,” “lower,” “bottom,” “above,” “upper,” “top,” “front,” “rear,” “left,” “right,” and the like, may be used for ease of description to describe one element’s or feature’s relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as “below” or “beneath” or “under” or “on bottom of” other elements or features would then be oriented “above” or “on top of” the other elements or features. Thus, the term “below” can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as “neighboring” one another means and includes features of the disclosed identity (or identities) that are located most proximate (e.g., closest to) one another. Additional features (e.g., additional regions, additional materials, additional structures, additional devices) not matching the disclosed identity (or identities) of the “neighboring” features may be disposed between the “neighboring” features. Put another way, the “neighboring” features may be positioned directly adjacent one another, such that no other feature intervenes between the “neighboring” features; or the “neighboring” features may be positioned indirectly adjacent one another, such that at least one feature having an identity other than that associated with at least one of the “neighboring” features is positioned between the “neighboring” features. Accordingly, features described as “vertically neighboring” one another means and includes features of the disclosed identity (or identities) that are located most vertically proximate (e.g., vertically closest to) one another. Moreover, features described as “horizontally neighboring” one another means and includes features of the disclosed identity (or identities) that are located most horizontally proximate (e.g., horizontally closest to) one another.

As used herein, the term “memory device” means and includes microelectronic devices exhibiting memory functionality, but not necessarily limited to memory functionality. Stated another way, and by way of example only, the term “memory device” means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, “conductive material” means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a “conductive structure” means and includes a structure formed of and including a conductive material.

As used herein, “insulative material” means and includes electrically insulative material, such as one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_x N_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

According to embodiments described herein, a microelectronic device comprises a stack structure comprising a vertically alternating sequence of insulative structures and conductive structures. Strings of memory cells vertically extend through the stack structure. Slot structures vertically extend through the stack structure and divide the microelectronic device into block structures, each block structure comprising some of the strings of memory cells. The slot structures individually comprise at least one insulative liner material contacting sidewalls of the vertically alternating sequence of insulative structures and conductive levels. A first material is formed on sidewalls of the at least one insulative liner material. The first material comprises first grains and second grains, the first grains having a larger dimension than the second grains. Each of the first grains laterally span an entire width between a first sidewall of the at least one insulative liner material and a laterally opposing second sidewall of the insulative liner material. Each of the second grains are individually in contact with only one of the first sidewall and the second sidewall of the at least one insulative liner material. In some embodiments, a volume between the first sidewall and the second sidewall that is unoccupied by the first grains and the second grains is filled with a second material. Forming the slot structures to include the first grains spanning the entire width of the slot structures facilitates a reduction in block bending of the microelectronic device compared to conventional microelectronic devices including conventional slot structures. In some embodiments, forming the first grains to span the entire width of the slot structures reduces a number of interfaces between the grains of the first material in the slot structure, reduces the number of relatively weak interfaces (e.g., silicon to silicon interfaces), or both. The reduction in the number of interfaces in the slot structure increases the strength of the microelectronic device structure.

The microelectronic device may be formed by forming a stack structure comprising a vertically alternating sequence of the insulative structures and additional insulative structures. Pillars comprising memory cell materials may be formed to vertically extend through the stack structure. Slots (e.g., trenches) are formed through the stack structure and are partially defined by sidewalls of the insulative structures and the additional insulative structures. The additional insulative structures are selectively removed (e.g., exhumed) through the slots. Conductive structures are formed between vertically neighboring insulative structures to form the vertical strings of memory cells. After forming the conductive structures, at least one insulative liner material is formed on the sidewalls of the insulative structures and the conductive structures defining the slots. Grains of a first material are formed on sidewalls of the at least one insulative liner material. In some embodiments, the grains of the first material are formed by exposing the at least one insulative liner material to a deposition composition and to an etchant composition. Exposing the at least one insulative liner material to the etchant composition facilitates controlling the nucleation density and the size distribution of the grains of the first material. The deposition conditions under which the first material is formed facilitate forming the first material to comprise first grains extending across an entire width of the slots (e.g., from a first sidewall of the at least one insulative liner material to a second, opposing sidewall of the at least one insulative liner material) and second grains having a smaller dimension than the first grains and not spanning the entire width of the slots. After forming the grains of the first material, remaining spaces between the sidewalls of the insulative liner material may be filled with a second material, such as one or more of an insulative material, a conductive material, or a semiconductive material (e.g., undoped silicon).

FIG. 1A through FIG. 1H illustrate a method of forming a microelectronic device structure, in accordance with embodiments of the disclosure. FIG. 1A is a simplified cross-sectional view of a microelectronic device structure 100 taken through section line A-A of FIG. 1B. The microelectronic device structure 100 may, for example, be formed into a portion of a microelectronic device of the disclosure, such as a memory device (e.g., a multi-deck 3D NAND Flash memory device, such as a dual-deck 3D NAND Flash memory device) of the disclosure, as described in further detail below.

Figure 1B:
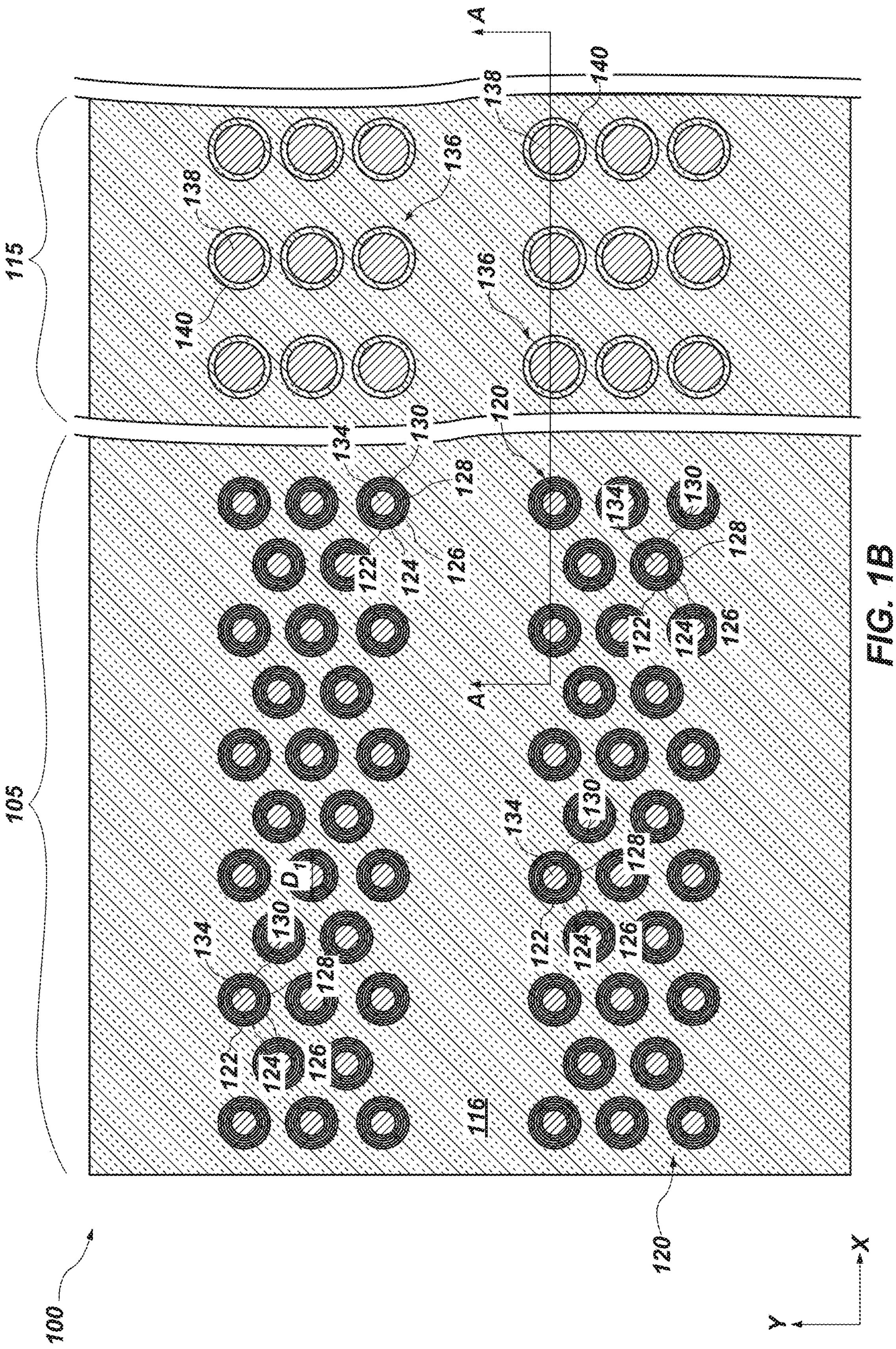

With reference to FIG. 1A and FIG. 1B, the microelectronic device structure 100 is formed to include an array region 105 and a staircase region 115 laterally neighboring (e.g., in the X-direction) the array region 105.

The microelectronic device structure 100 is formed to include a stack structure 102 having a vertically alternating (e.g., in the Z-direction) sequence of insulative structures 104 (also referred to herein as "insulative levels") and additional insulative structures 106 (also referred to herein as "additional insulative levels") arranged in tiers 108. Each of the tiers 108 of the stack structure 102 may include at least one (1) of the insulative structures 104 vertically neighboring at least one (1) of the additional insulative structures 106. The insulative structures 104 and the additional insulative structures 106 may be interleaved with each other.

The insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide ($MgO$), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 of each of the tiers 108 of the stack structure 102 exhibits a substantially homogeneous distribution of insulative material. In additional embodiments, at least one of the insulative structures 104 of at least one of the tiers 108 of the stack structure 102 exhibits a substantially heterogeneous distribution of at least one insulative material. The insulative structures 104 may, for example, be formed of and include a stack (e.g., laminate) of at least two different insulative materials. The insulative structures 104 of each of the tiers 108 of the stack structure 102 may each be substantially planar, and may each individually exhibit a desired thickness.

The levels of the additional insulative structures 106 may be formed of and include an insulative material that is different than, and exhibits an etch selectivity with respect to, the insulative structures 104. In some embodiments, the additional insulative structures 106 are formed of and include a nitride material (e.g., silicon nitride ($Si_3N_4$)) or an oxynitride material (e.g., silicon oxynitride). In some embodiments, the additional insulative structures 106 comprise silicon nitride.

Although FIG. 1A illustrates a particular number of tiers 108 of the insulative structures 104 and the additional insulative structures 106, the disclosure is not so limited. In some embodiments, the stack structure 102 includes a desired quantity of the tiers 108, such as within a range of from thirty-two (32) of the tiers 108 to two hundred fifty-six (256) of the tiers 108. In some embodiments, the stack structure 102 includes sixty-four (64) of the tiers 108. In other embodiments, the stack structure 102 includes a different number of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108, greater than two hundred fifty-six (256) of the tiers 108) of the insulative structures 104 and the additional insulative structures 106. In addition, in some embodiments, the stack structure 102 overlies a deck structure comprising additional tiers 108 of insulative structures 104 and the additional insulative structures, separated from the stack structure 102 by at least one dielectric material, such as an interdeck insulative material.

With continued reference to FIG. 1A, the microelectronic device structure 100 is formed to further include a source tier 110 vertically underlying (e.g., in the Z-direction) the stack structure 102. The source tier 110 may comprise, for example, a first source material 112 and a second source material 114. The first source material 112 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy), a conductive metal-containing material (e.g., a conductive metal nitride, a conductive metal silicide, a conductive metal carbide, a conductive metal oxide), or a doped semiconductor material (e.g., a semiconductor material doped with one or more P-type dopants (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorus, antimony, and bismuth)). In some embodiments, the first source material 112 comprises conductively-doped silicon.

The second source material 114 may be formed of and include one or more of a metal silicide material (e.g., tungsten silicide ($WSi_x$)), a metal nitride material (e.g., tungsten nitride), and a metal silicon nitride material (e.g., tungsten silicon nitride ($WSi_xN_y$)). In some embodiments, the second source material 114 comprises tungsten silicide.

A dielectric material 116 may vertically (e.g., in the Z-direction) overlie a vertically uppermost tier 108 of the insulative structures 104 and the additional insulative structures 106. The dielectric material 116 may comprise one or more of the materials described above with reference to the insulative structures 104. In some embodiments, the dielectric material 116 comprises silicon dioxide.

With combined reference to FIG. 1A and FIG. 1B, pillars 120 may be formed to extend through the stack structure 102 and to the source tier 110 (e.g., the first source material 112). The pillars 120 may vertically extend (e.g., in the Z-direction) through the stack structure 102. As will be described herein, materials of the pillars 120 may be employed to form strings (e.g., strings 156 (FIG. 1C)) of memory cells (e.g., memory cells 158 (FIG. 1C)).

Referring to FIG. 1B, pillars 120 that laterally neighbor one another in the X-direction may be offset from each other in the Y-direction. Accordingly, the pillars 120 may be arranged in a so-called weave pattern, which may facilitate an increased density of the pillars 120 (and the resulting strings (e.g., strings 156 (FIG. 1C))) of memory cells (e.g., memory cells 158 (FIG. 1C)) to be formed from the pillars 120. However, the disclosure is not so limited and the pillars 120 may be arranged in other patterns (e.g., lines wherein the pillars 120 of each line are aligned with pillars 120 of each of the other lines). In some embodiments, each pillar 120 may be surrounded by six (6) other pillars 120 and may be arranged in a hexagonal pattern.

The pillars 120 may individually have a horizontal dimension (e.g., diameter) $D_1$ within a range of from about 60 nanometers (nm) to about 120 nm, such as from about 60 nm to about 80 nm, from about 80 nm to about 100 nm, or from about 100 nm to about 120 nm. In some embodiments, the horizontal dimension $D_1$ is about 100 nm. However, the disclosure is not so limited and the horizontal dimension $D_1$ may be different than those described.

The pillars 120 may each individually comprise a barrier material 122 horizontally neighboring the levels of the insulative structures 104 and the additional insulative structures 106 of one of the tiers 108 of the stack structure 102; a charge blocking material (also referred to as a "dielectric blocking material") 124 horizontally neighboring the barrier material 122; a memory material 126 horizontally neighboring the charge blocking material 124; a tunnel dielectric material (also referred to as a "tunneling dielectric material") 128 horizontally neighboring the memory material 126; a channel material 130 horizontally neighboring the tunnel dielectric material 128; and an insulative material 132 in a center portion of the pillars 120. The channel material 130 may be horizontally interposed between the insulative material 132 and the tunnel dielectric material 128; the tunnel dielectric material 128 may be horizontally interposed between the channel material 130 and the memory material 126; the memory material 126 may be horizontally interposed between the tunnel dielectric material 128 and the charge blocking material 124; the charge blocking material 124 may be horizontally interposed between the memory material 126 and the barrier material 122; and the barrier material 122 may be horizontally interposed between the charge blocking material 124 and the levels of the insulative structures 104 and additional insulative structures 106. In some embodiments, the barrier material 122, the charge blocking material 124, the memory material 126, and the tunnel dielectric material 128 are collectively referred to herein as "memory cell materials."

In some embodiments, the pillars 120 do not include the barrier material 122 and the charge blocking material 124 horizontally neighbors the levels of the insulative structures 104 and additional insulative structures 106.

The barrier material 122 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the barrier material 122 comprises aluminum oxide.

The charge blocking material 124 may be formed of and include a dielectric material such as, for example, one or more of an oxide (e.g., silicon dioxide), a nitride (silicon nitride), and an oxynitride (silicon oxynitride), or another material. In some embodiments, the charge blocking material 124 comprises silicon oxynitride.

The memory material 126 may comprise a charge trapping material or a conductive material. The memory material 126 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 126 comprises silicon nitride.

The tunnel dielectric material 128 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 128 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 128 comprises silicon dioxide. In other embodiments, the tunnel dielectric material 128 comprises nitrogen, such as an oxynitride. In some such embodiments, the tunnel dielectric material 128 comprises silicon oxynitride.

In some embodiments the tunnel dielectric material 128, the memory material 126, and the charge blocking material 124 together comprise a structure configured to trap a charge, such as, for example, an oxide-nitride-oxide (ONO) structure. In some such embodiments, the tunnel dielectric material 128 comprises silicon dioxide, the memory material 126 comprises silicon nitride, and the charge blocking material 124 comprises silicon dioxide. In other embodiments, the tunnel dielectric material 128, the memory material 126, and the charge blocking material 124 together comprise an oxide-nitride-oxynitride structure. In some such embodiments, the tunnel dielectric material 128 comprises silicon oxynitride, the memory material 126 comprises silicon nitride, and the charge blocking material 124 comprises silicon dioxide.

The channel material 130 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 130 includes amorphous silicon or polysilicon. In some embodiments, the channel material 130 comprises a doped semiconductor material.

The insulative material 132 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 132 comprises silicon dioxide.

After forming the pillars 120, vertically oriented (e.g., in the Z-direction) surfaces of the microelectronic device structure 100 may be exposed to a chemical mechanical planarization (CMP) process to remove laterally oriented (e.g., in the X-direction, in the Y-direction) portions of the barrier material 122, the charge blocking material 124, the memory material 126, the tunnel dielectric material 128, the channel material 130, and the insulative material 132.

With continued reference to FIG. 1A, a conductive contact structure 135 may be in electrical communication with the channel material 130 of the pillars 120. The conductive contact structure 135 comprises a conductive material 134 in electrical communication with the channel material 130.

The conductive contact structure 135 may be in electrical communication with, for example, a conductive line for providing access to strings (e.g., strings 156 (FIG. 1C)) of memory cells (e.g., memory cells 158 (FIG. 1C)) formed from the pillars 120.

With continued reference to FIG. 1A and FIG. 1B, the staircase region 115 may include at least one stair step structure 125 including steps 127 comprising horizontal edges (e.g., horizontal ends) of the tiers 108 of the insulative structures 104 and additional insulative structures 106. The number of steps 127 of the stair step structure 125 may be less than or equal to a number (e.g., quantity) of the tiers 108 of the insulative structures 104 and the additional insulative structures 106.

Although FIG. 1A illustrates that the stair step structure 125 includes only a particular number of steps 127, the disclosure is not so limited. In some embodiments, the stair step structure 125 includes a number of steps 127 corresponding to the number of tiers 108 of the insulative structures 104 and the additional insulative structures 106. For example, the number of steps 127 of the stair step structure 125 may be within a range of from thirty-two (32) steps 127 to two hundred fifty-six (256) steps 127. In some such embodiments, it will be understood that the stair step structure 125 continues in the lateral direction (e.g., in the X-direction) beyond that which is illustrated in FIG. 1A. In some embodiments, a lowermost one of the tiers 108 of the insulative structures 104 and the additional insulative structures 106 comprises a lowermost one of the steps 127 and comprises edges that are laterally (e.g., in the X-direction) offset from edges of a vertically (e.g., in the Z-direction) neighboring tier 108.

The staircase region 115 may include pillar structures (e.g., support pillar structures) 136 within a horizontal area thereof. The pillar structures 136 may each individually comprise a first material 138 vertically extending through the stack structure 102 and to the source tier 110, and a liner material 140 on sidewalls of the first material 138. In some embodiments, the pillar structures 136 within the stair step structure 125 terminate (e.g., land on) the second source material 114. The liner material 140 may substantially surround (e.g., substantially horizontally and vertically cover) sidewalls of the first material 138. In some embodiments, at least some of the pillar structures 136 are in electrical communication with a structure (e.g., a CMOS structure) underlying the source tier 110.

The first material 138 may be formed of and include at least one conductive material, such as such as one or more of at least one metal (e.g., W, Ti, Mo, Nb, V, Hf, Ta, Cr, Zr, Fe, Ru, Os, Co, Rh, Ir, Ni, Pd, Pt, Cu, Ag, Au, Al), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), at least one conductive metal-containing material (e.g., a conductive metal nitride, a conductive metal silicide, a conductive metal carbide, a conductive metal oxide), and at least one conductively-doped semiconductor material (e.g., conductively-doped Si, conductively-doped Ge, conductively-doped SiGe). In some embodiments, the first material 138 of each of the pillar structures 136 has substantially the same material composition.

In other embodiments, the first material 138 is formed of and includes at least one insulative material. In some such embodiments, the first material 138 is formed of and includes at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the first material 138 comprises $SiO_2$. In some embodiments, such as where the first material 138 comprises an insulative material, the microelectronic device structure 100 does not include the liner material 140 on sidewalls of the first material 138 and the pillar structures 136 may comprise only the first material 138 (e.g., the insulative material).

The pillar structures 136 may each individually exhibit a desired geometric configuration (e.g., dimensions and shape) and spacing. The geometric configurations and spacing of the pillar structures 136 may be selected at least partially based on the configurations and positions of other components (e.g., the steps 127 of the stair step structure 125, conductive contact structures to be formed in contact with the steps 127 of the stair step structure 125, the source tier 110) of the microelectronic device structure 100. For example, the pillar structures 136 may each individually have a geometric configuration and spacing permitting the pillar structure 136 to vertically-extend (e.g., in the Z-direction) through the stack structure 102 and physically contact (e.g., land on) a structure of the source tier 110 to facilitate a predetermined function (e.g., an electrical interconnection function, a support function) of the pillar structure 136. In other embodiments, the pillar structures 136 do not include an electrical interconnection function and serve primarily (e.g., only) a support function. Each of the pillar structures 136 may exhibit substantially the same geometric configuration (e.g., the same dimensions and the same shape) and horizontal spacing (e.g., in the X-direction) as each of the other pillar structures 136, or at least some of the pillar structures 136 may exhibit a different geometric configuration (e.g., one or more different dimensions, a different shape) and/or different horizontal spacing than at least some other of the pillar structures 136. In some embodiments, the pillar structures 136 are at least partially uniformly spaced in the X-direction and in the Y-direction.

The pillar structures 136 may serve as support structures during and/or after the formation of one or more components of the microelectronic device structure 100. For example, the pillar structures 136 may serve as support structures for the formation of conductive structures (e.g., conductive structures 144 (FIG. 1C)) during at least partial replacement of the additional insulative structures 106 to form the conductive structures, as will be described herein. The pillar structures 136 may impede (e.g., prevent) tier collapse during the selective removal of the additional insulative structures 106.

The liner material 140 may be horizontally interposed between each of the first materials 138 of the pillar structures 136 and the tiers 108 (including the insulative structures 104 and the additional insulative structures 106 thereof) of the stack structure 102.

The liner material 140 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the liner material 140 comprises $SiO_2$. In some embodiments, the liner material 140 has a different material composition than one or both of the dielectric material 116 and the insulative structures 104. In other embodiments, the liner material 140 has the same material composition as one or both of the dielectric material 116 and the insulative structures 104. In some embodiments, the liner material 140 comprises a material composition that is not substantially removed responsive to exposure to etch chemistries formulated and configured to remove silicon nitride.

Figure 1C:
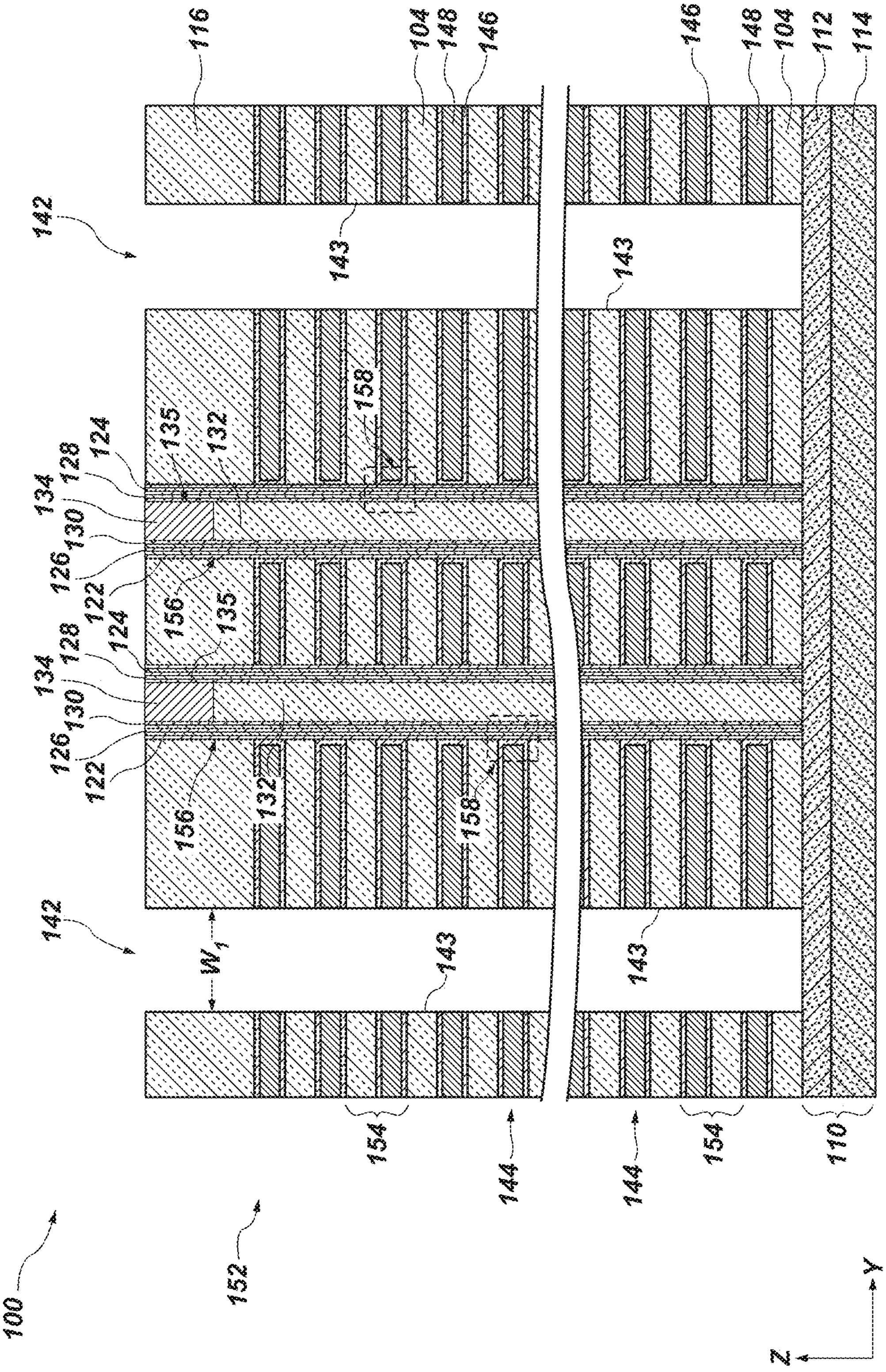
Figure 1D:
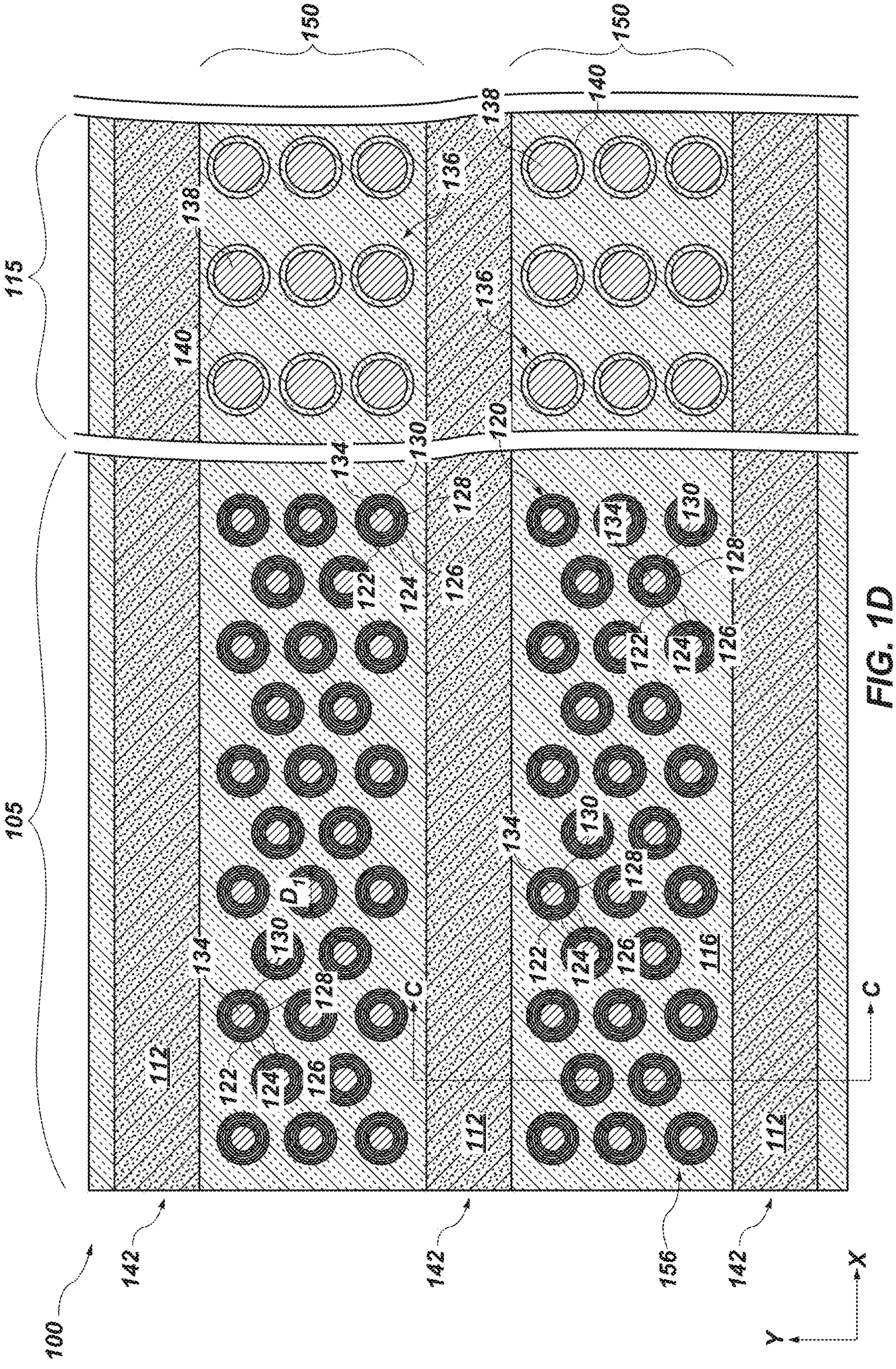

With combined reference to FIG. 1C and FIG. 1D, after forming the pillars 120 (FIG. 1A, FIG. 1B), slots 142 (also referred to herein as "replacement gate slots") (e.g., trenches) may be formed through the stack structure 102 to facilitate at least partial replacement of the additional insulative structures 106 (FIG. 1A) to form conductive structures 144 comprising a conductive liner material 146 and a conductive material 148 through so-called "replacement gate" or "gate last" processing acts and to form block structures 150 in the microelectronic device structure 100 separated from each other by the slots 142. FIG. 1C is a simplified cross-sectional view of the microelectronic device structure 100 taken through section line CC of FIG. 1D, which is a top view of the microelectronic device structure 100. The slots 142 may extend through the dielectric material 116, and the tiers 108 of the insulative structures 104 and the additional insulative structures (FIG. 1A). In some embodiments, the slots 142 may expose one or more features within the source tier 110, such as the first source material 112. In some embodiments, and with reference to FIG. 1D, the slots 142 laterally (e.g., in the X-direction) extend from the array region 105 to the staircase region 115.

A width $W_1$ (e.g., in the Y-direction) of the slots 142 may be within a range of from about 100 nanometers (nm) to about 600 nm, such as from about 100 nm to about 200 nm, from about 200 nm to about 300 nm, from about 300 nm to about 400 nm, from about 400 nm to about 500 nm, or from about 500 nm to about 600 nm. In some embodiments, the width $W_1$ is within a range of from about 100 nm to about 300 nm. In other embodiments, the width $W_1$ is within a range of from about 200 nm to about 300 nm.

The slots 142 may be at least partially defined by sidewalls 143 and an exposed surface of the source tier 110 (e.g., an exposed surface of the first source material 112). In some embodiments, the sidewalls 143 extend substantially vertically (e.g., in the Z-direction) with respect to a major surface of the source tier 110.

After forming the slots 142, the additional insulative structures 106 (FIG. 1A) may be selectively removed (e.g., exhumed) through the slots 142. Spaces between vertically neighboring (e.g., in the Z-direction) insulative structures 104 may be filled with the conductive liner material 146 and the conductive material 148 to form the conductive structures 144 and a stack structure 152 including tiers 154 of the insulative structures 104 and the conductive structures 144 comprising the conductive liner material 146 and the conductive material 148. The conductive structures 144 may be located at locations corresponding to the locations of the additional insulative structures 106 removed through the slots 142.

At least one lower level of the conductive structures 144 of the stack structure 152 may be employed as at least one lower select gate (e.g., at least one source side select gate (SGS)) of the microelectronic device structure 100. In some embodiments, a single (e.g., only one) conductive structure 144 of a vertically lowermost tier 154 of the stack structure 152 is employed as a lower select gate (e.g., a SGS) of the microelectronic device structure 100. In addition, upper conductive level(s) of the conductive structures 144 of the stack structure 152 may be employed as upper select gate(s) (e.g., drain side select gate(s) (SGDs)) of the microelectronic device structure 100. In some embodiments, horizontally-neighboring conductive structures 144 of a vertically uppermost tier 154 of the stack structure 152 (e.g., separated from each other by additional slots 142) are employed as upper select gates (e.g., SGDs) of the microelectronic device structure 100. In some embodiments, more than one (e.g., two, four, five, six) conductive structures 144 are employed as an upper select gate (e.g., a SGD) of the microelectronic device structure 100.

Although FIG. 1C and FIG. 1D illustrate only one slot 142 and only two block structures 150, the disclosure is not so limited. The microelectronic device structure 100 may include a plurality of (e.g., four, five, six, eight, more than eight) block structures 150, each separated from laterally neighboring (e.g., in the Y-direction) block structures 150 by a slot 142. In other words, the slots 142 may divide the microelectronic device structure 100 into any desired number of block structures 150.

The conductive material 148 of the conductive structures 144 may be formed of and include at least one conductive material, such as at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively-doped semiconductor material (e.g., conductively-doped polysilicon, conductively-doped germanium (Ge), conductively-doped silicon germanium (SiGe)), at least one conductive metal-containing material (e.g., a conductive metal nitride, a conductive metal silicide, a conductive metal carbide, a conductive metal oxide), or combinations thereof. In some embodiments, the conductive material 148 is formed of and includes tungsten.

The conductive material 148 of each of the conductive structures 144 may individually include a substantially homogenous composition, or a substantially heterogeneous composition. In some embodiments, the conductive material 148 of each of the conductive structures 144 of each of the tiers 154 of the stack structure 152 exhibits a substantially homogeneous composition. In additional embodiments, at least one of the conductive structures 144 of at least one of the tiers 154 of the stack structure 152 exhibits a substantially heterogeneous composition. The conductive material 148 may, for example, be formed of and include at least two different conductive materials. The conductive structures 144 of each of the tiers 154 of the stack structure 152 may each be substantially planar, and may each exhibit a desired thickness.

The conductive liner material 146 may be in contact with the insulative structures 104 and may be located, for example, between the insulative structures 104 and the conductive material 148 of the conductive structures 144. The conductive liner material 146 may be formed of and include, for example, a seed material from which the conductive structures 144 may be formed. The conductive liner material 146 may be formed of and include, for example, a metal (e.g., titanium, tantalum), a metal nitride (e.g., tungsten nitride, titanium nitride, tantalum nitride), or another material. In some embodiments, the conductive liner material comprises titanium nitride. In some embodiments, the conductive liner material 146 comprises a first portion comprising a first material in contact with the insulative structures 104 and a second portion comprising a second material in contact with and between the first material and the conductive material 148. In some embodiments, the first material comprises aluminum oxide and the second material comprises titanium nitride.

With continued reference to FIG. 1C and FIG. 1D, formation of the conductive structures 144 may form strings 156 of memory cells 158, each memory cell 158 located at an intersection of a conductive structure 144 and the memory cell materials (e.g., the barrier material 122, the charge blocking material 124, the memory material 126, and the tunnel dielectric material 128) and the channel material 130.

Although the microelectronic device structure 100 has been described and illustrated as comprising memory cells 158 having a particular configuration, the disclosure is not so limited. In some embodiments, the memory cells 158 may comprise so-called "MONOS" (metal-oxide-nitride-oxide-semiconductor) memory cells. In additional embodiments, the memory cells 158 comprise so-called "TANOS" (tantalum nitride-aluminum oxide-nitride-oxide-semiconductor) memory cells, or so-called "BETANOS" (band/barrier engineered TANOS) memory cells, each of which is a subset of MONOS memory cells. In other embodiments, the memory cells 158 comprise so-called "floating gate" memory cells including floating gates (e.g., metallic floating gates) as charge storage structures. The floating gates may horizontally intervene between central structures of the strings 156 and the conductive structures 144.

Although FIG. 1C has been described as including the conductive structures 144 comprising the conductive liner material 146 and the conductive material 148, the disclosure is not so limited. In other embodiments, the conductive structures 144 do not include the conductive liner material 146 and the conductive material 148 directly contacts the insulative structures 104. In some such embodiments, the conductive material 148 is directly vertically (e.g., in the Z-direction) neighboring and physically contacting the insulative structures 104.

Figure 1E:
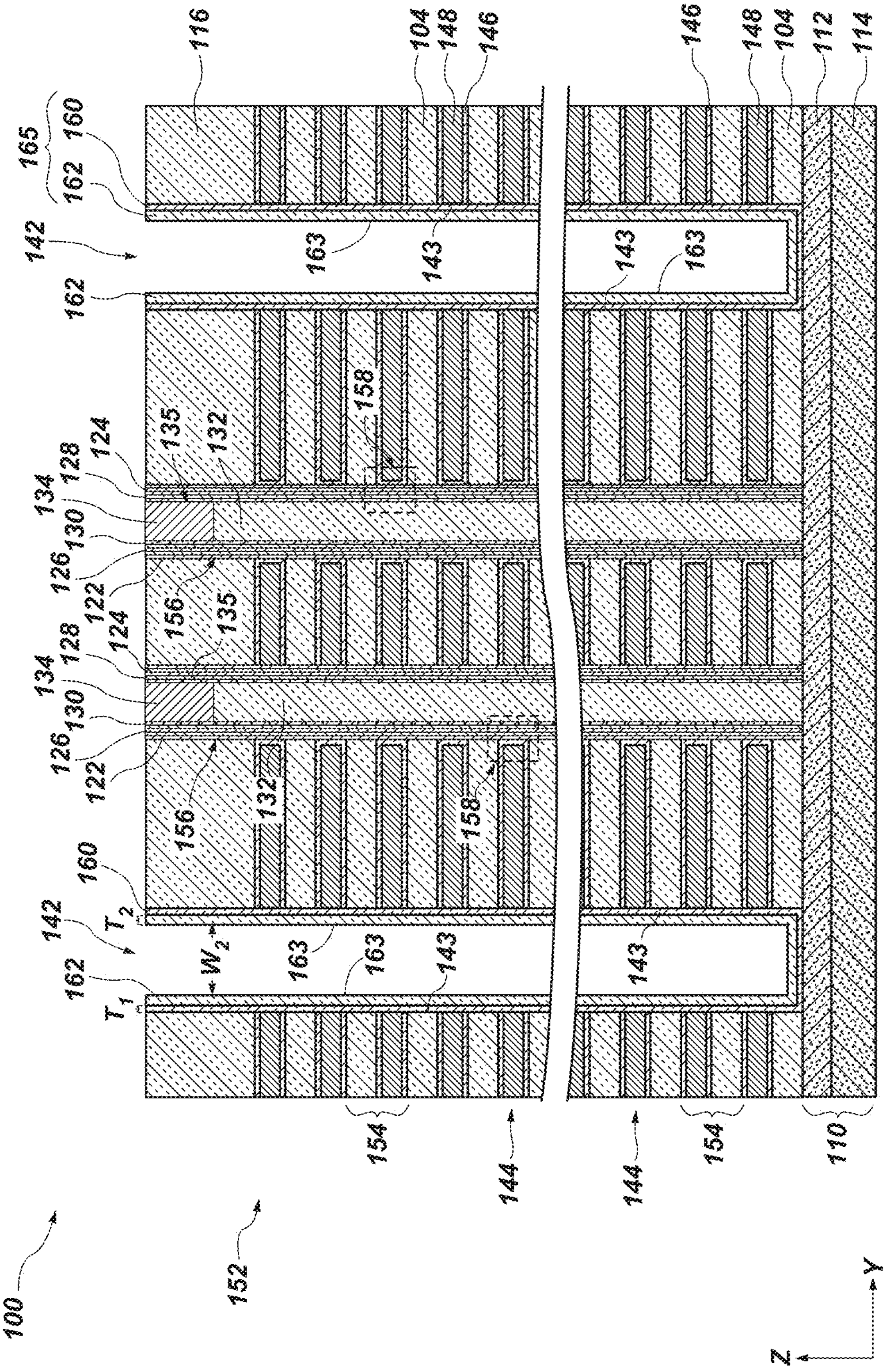

Referring now to FIG. 1E, which illustrates the same cross-sectional view of the microelectronic device structure 100 of FIG. 1C, after forming the conductive structure 144 by way of the slots 142, an insulative liner material 165 comprising a first insulative liner material 160 and a second insulative liner material 162 may be formed within the slots 142, such as on the sidewalls 143 defining the slots 142, and the exposed surfaces of the source tier 110. In some embodiments, the first insulative liner material 160 is formed on sidewalls 143 of the slots 142 and the second insulative liner material 162 is formed within the slots 142 and over the first insulative liner material 160.

In some embodiments, the first insulative liner material 160 and the second insulative liner material 162 substantially mitigate (e.g., prevent) electrical shorting between vertically (e.g., in the Z-direction) neighboring conductive structures 144 during subsequent processing acts. Stated another way, the first insulative liner material 160 and the second insulative liner material 162 may substantially mitigate or prevent electrical connection between vertically neighboring conductive structures 144.

A thickness $T_1$ of the first insulative liner material 160 may be within a range of from about 5 nm to about 15 nm, such as from about 5 nm to about 10 nm, or from about 10 nm to about 15 nm.

A thickness $T_2$ of the second insulative liner material 162 may be within a range of from about 25 nm to about 50 nm, such as from about 25 nm to about 30 nm, from about 30 nm to about 35 nm, from about 35 nm to about 40 nm, or from about 40 nm to about 50 nm. In some embodiments, the thickness $T_2$ of the second insulative liner material 162 is within a range of from about 30 nm to about 35 nm. In some embodiments, the thickness $T_2$ of the second insulative liner material 162 is greater than the thickness $T_1$ of the first insulative liner material 160.

In some embodiments, a combined thickness of the first insulative liner material 160 and the second insulative liner material 162 (e.g., a sum of the thickness $T_1$ and the thickness $T_2$) is less than about 50 nm, such as less than about 40 nm.

Each of the first insulative liner material 160 and the second insulative liner material 162 may individually be formed by one or more of ALD, CVD, plasma enhanced ALD, PVD, PECVD, and LPCVD. In some embodiments, the first insulative liner material 160 and the second insulative liner material 162 are individually formed by ALD.

The first insulative liner material 160 may be formed of and include insulative material, such as one or more of the materials described above with reference to the additional insulative structures 106 (FIG. 1A). In some embodiments, the first insulative liner material 160 comprises substantially the same material composition as the additional insulative structures 106. In other embodiments, the first insulative liner material 160 comprises a different material composition than the additional insulative structures 106. In some embodiments, the first insulative liner material 160 comprises a nitride material, such as silicon nitride.

The second insulative liner material 162 may be formed of and include insulative material, such as one or more of the materials described above with reference to the insulative structures 104. In some embodiments, the second insulative liner material 162 comprises substantially the same material composition as the insulative structures 104. In other embodiments, the second insulative liner material 162 comprises a different material composition than the insulative structures 104. In some embodiments, the second insulative liner material 162 comprises an oxide material, such as silicon dioxide. In some embodiments, the second insulative liner material 162 comprises a different material composition than the first insulative liner material 160.

Although FIG. 1E illustrates that the insulative liner material 165 comprises the first insulative liner material 160 and the second insulative liner material 162, the disclosure is not so limited. In other embodiments, the insulative liner material 165 further comprises a third insulative liner material, such as overlying the second insulative liner material 162. In some such embodiments, the second insulative liner material 162 is laterally disposed between the first insulative liner material 160 and the third insulative liner material.

In some embodiments, sidewalls 163 of the second insulative liner material 162 at least partially define the remaining portions of the slots 142. A width $W_2$ between laterally opposing sidewalls 163 of the second insulative liner material 162 of the slots 142 may be within a range of from about 100 nm to about 550 nm, such as from about 100 nm to about 200 nm, from about 200 nm to about 300 nm, from about 300 nm to about 400 nm, from about 400 nm to about 500 nm, or from about 500 nm to about 550 nm. In some embodiments, the width $W_2$ is within a range of from about 200 nm to about 300 nm.

Figure 1F:
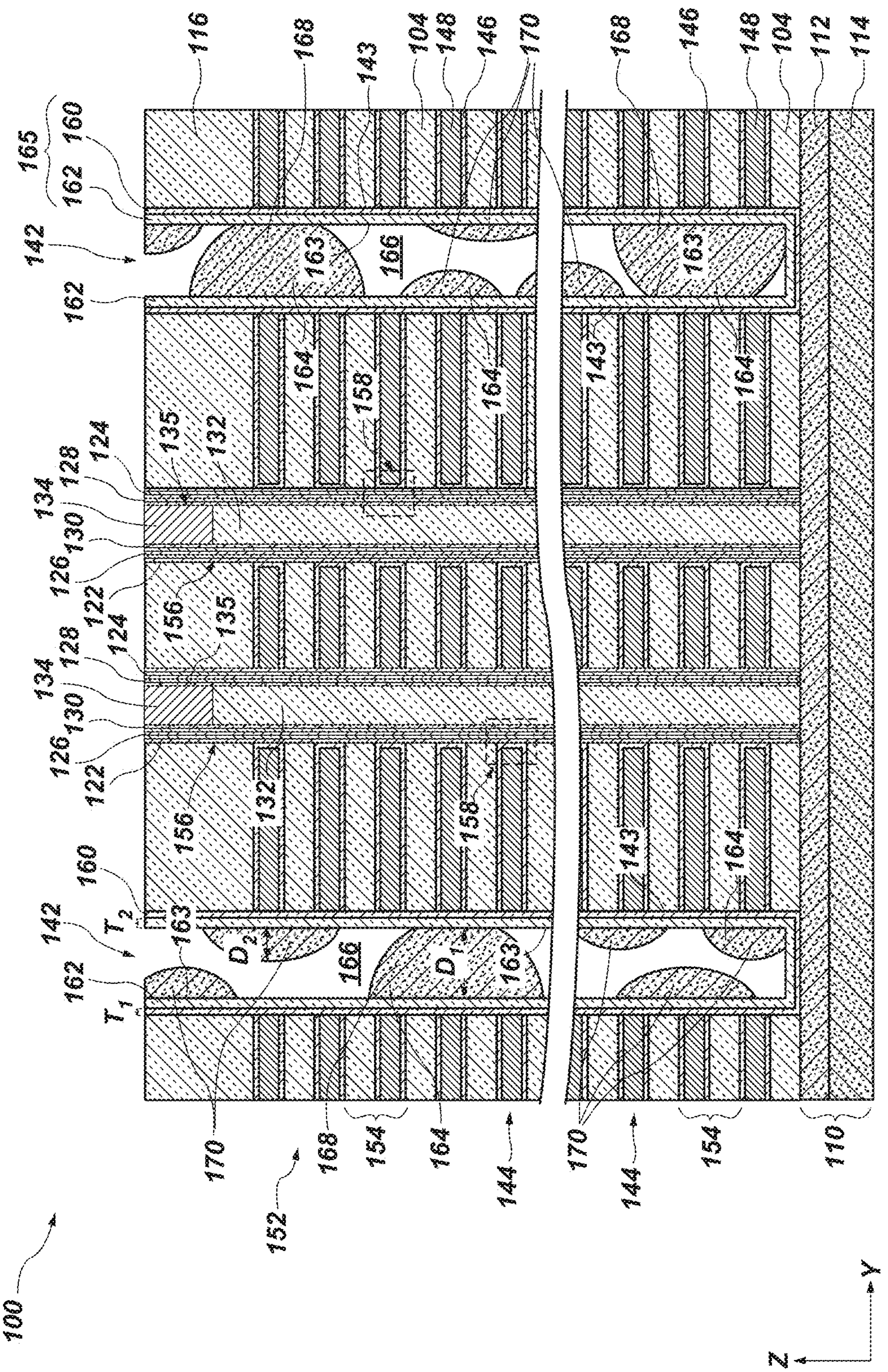

With reference to FIG. 1F, after forming the first insulative liner material 160 and the second insulative liner material 162 within the slots 142 (FIG. 1E), grains (e.g., granules) of a first material 164 at least partially fill the slots 142 and leave unfilled portions 166 within the slots 142. The grains of the first material 164 include first grains 168 and second grains 170. The first grains 168 and the second grains 170 may comprise substantially the same material composition. In some embodiments, the composition of the second insulative liner material 162 (on which the grains of the first material 164 are formed) and the surface of the sidewalls 163 may affect nucleation of the grains of the first material 164 and the size and density of the grains of the first material 164.

Each of the first grains 168 and the second grains 170 may individually exhibit a desired geometric configuration (e.g., dimensions and shape) and spacing. The geometric configurations and spacing of the first grains 168 and the second grains 170 may individually exhibit a spherical shape, a cylindrical shape, a hemispherical shape, a prismatic shape, or a rod shape. In some embodiments, the first grains 168 and the second grains 170 individually exhibit a hemispherical shape.

In some embodiments, the first grains 168 and the second grains 170 of the first material collectively fill from about 20 percent to about 80 percent of the volume defined by the slots 142 (e.g., the volume defined between opposing sidewalls of the second insulative liner material 162), such as from about 20 percent to about 30 percent, from about 30 percent to about 40 percent, from about 40 percent to about 50 percent, from about 50 percent to about 60 percent, from about 60 percent to about 70 percent, or from about 70 percent to about 80 percent of a volume defined by the slots 142.

In some embodiments, the unfilled portions 166 of the slots 142 comprise from about 20 percent to about 80 percent of the volume defined by the slots 142. In some embodiments, the first grains 168 and the second grains 170 fill from about 30 percent to about 70 percent of a volume defined by the slots 142.

In some embodiments, the first grains 168 exhibit a larger dimension (e.g., diameter) than the second grains 170. In some embodiments, the first grains 168 extend from a first sidewall 163 of the insulative liner material 165 (e.g., the first sidewall 163 of the second insulative liner material 162) to a laterally opposing (e.g., in the Y-direction) sidewall 163 of the insulative liner material 165 (e.g., a laterally opposing sidewall 163 of the second insulative liner material 162). In some such embodiments, the first grains 168 laterally span substantially the entire width $W_2$ (FIG. 1E) of the slots 142. In some such embodiments, the first grains 168 contact a first sidewall 163 of the insulative liner material 165 and a second, opposing sidewall 163 of the insulative liner material 165. Stated another way, in some embodiments, a single grain of the first grains 168 may laterally span substantially the entire width $W_2$ (FIG. 1E) of the slots 142 from a first sidewall 163 of the insulative liner material 165 (e.g., the first sidewall 163 of the second insulative liner material 162) to a laterally opposing (e.g., in the Y-direction) sidewall 163 of the insulative liner material 165 (e.g., a laterally opposing sidewall 163 of the second insulative liner material 162).

In some embodiments, a mean grain maximum dimension $D_{1,\ max}$ of the first grains 168 may be within a range of from about 100 nm to about 550 nm, such as from about 100 nm to about 200 nm, from about 200 nm to about 300 nm, from about 300 nm to about 400 nm, from about 400 nm to about 500 nm, or from about 500 nm to about 550 nm. In some embodiments, the mean grain maximum dimension $D_{1,\ max}$ is within a range of from about 200 nm to about 300 nm.

In some embodiments, a mean grain maximum dimension $D_{2,\ max}$ of the second grains 170 may be within a range of from about 50 nm to about 300 nm, such as from about 50 nm to about 100 nm, from about 100 nm to about 150 nm, from about 150 nm to about 200 nm, from about 100 nm to about 250 nm, or from about 250 nm to about 300 nm. In some embodiments, the mean grain maximum dimension $D_{2,\ max}$ is less than about 150 nm, such as less than about 100 nm, or less than about 50 nm. In some embodiments, the mean grain maximum dimension $D_{2,\ max}$ of the second grains 170 may be less than about one-half of the mean grain maximum dimension $D_{1,\ max}$ of the first grains 168. In some embodiments, the mean grain maximum dimension $D_{2,\ max}$ of the second grains 170 is less than about one-half the width $W_2$.

The second grains 170 may exhibit one or more relatively smaller dimensions (e.g., a maximum horizontal width, a diameter) than one or more corresponding dimensions (e.g., a maximum horizontal width, a diameter) of the first grains 168. In some embodiments, each second grain 170 individually contacts one sidewall 163 of the insulative liner material 165 and does not contact the laterally (e.g., in the Y-direction) opposing sidewall 163 of the insulative liner material 165. In other words, each of the second grains 170 individually contacts only one sidewall 163 of the insulative liner material 165.

In some embodiments, at least some of the second grains 170 nucleate from another of the second grains 170. In some such embodiments at least some of the second grains 170 do not contact a sidewall 163 of the insulative liner material 165; rather, the at least some of the second grains 170 contact an additional one of the second grains 170. The additional one of the second grains 170 may be laterally interposed between two second grains 170 or may be laterally interposed between one of the second grains 170 and the sidewall 163 of the insulative liner material 165. In some embodiments, at least some of the second grains 170 contact each other proximate a lateral (e.g., in the Y-direction) center of the slots 142. By way of non-limiting example, a first one of the second grains 170 may contact a first sidewall 163 of the insulative liner material 165 and a second one of the second grains 170 proximate a lateral center of the slots 142. The second one of the second grains 170 may contact the first one of the second grains 170 and may contact a second sidewall 163 of the insulative liner material 165 laterally opposing the first sidewall 163 of the insulative liner material 165.

In some embodiments, a total number of the first grains 168 and the second grains 170 (e.g., a density of a total number of the grains) is within a range of from about 0.3 grains per square micrometer ($\mu m^2$) to about 300 grains/$\mu m^2$, such as from about 0.3 grains/$\mu m^2$ to about 3 grains/$\mu m^2$, from about 1 grain/$\mu m^2$ to about 10 grains/$\mu m^2$, from about 3 grains/$\mu m^2$ to about 30 grains/$\mu m^2$, from about 10 grains/$\mu m^2$ to about 100 grains/$\mu m^2$, or from about 30 grains/$\mu m^2$ to about 300 grains/$\mu m^2$. In some embodiments, the density of the first grains 168 is about 1 grain/$\mu m^2$.

In some embodiments, the first grains 168 constitute from about 5 volume percent to about 100 volume percent of the total volume of the grains (e.g., the total combined volume of the first grains 168 and the second grains 170), such as from about 5 volume percent to about 10 volume percent, from about 10 volume percent to about 15 volume percent, from about 15 volume percent to about 20 volume percent, from about 20 volume percent to about 30 volume percent, from about 30 volume percent to about 40 volume percent, from about 40 volume percent to about 50 volume percent, from about 50 volume percent to about 60 volume percent, from about 60 volume percent to about 70 volume percent, from about 70 volume percent to about 80 volume percent, from about 80 volume percent to about 90 volume percent, or from about 90 volume percent to about 100 volume percent of the total volume of grains. In some embodiments, the first grains 168 constitute from about 5 volume percent to about 20 volume percent, such as from about 5 volume percent to about 15 volume percent of the total volume of grains. The second grains 170 may constitute the remaining volume percent of the grains of the first material 164.

In some embodiments, the first grains 168 may constitute from about 1 percent to about 100 percent of the total number of grains (e.g., the total number of grains of the first grains 168 and the second grains 170), such as from about 1 percent to about 3 percent, from about 3 percent to about 5 percent, from about 5 percent to about 10 percent, from about 10 percent to about 20 percent, from about 20 percent to about 30 percent, from about 30 percent to about 40 percent, from about 40 percent to about 50 percent, from about 50 percent to about 60 percent, from about 60 percent to about 70 percent, from about 70 percent to 90 percent, or from about 90 percent to about 100 percent of the total number of grains. In some embodiments, the first grains constitute from about 5 percent to about 10 percent of the total number of grains. The second grains 170 may constitute the remaining percent of the total number of grains of the first material 164.

The first material 164 of the first grains 168 and the second grains 170 may individually be formed of and include conductive material, such as, for example, one or more of at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively-doped semiconductor material (e.g., conductively-doped polysilicon, conductively-doped germanium (Ge), conductively-doped silicon germanium (SiGe)), at least one conductive metal-containing material (e.g., a conductive metal nitride, a conductive metal silicide, a conductive metal carbide, a conductive metal oxide), at least one undoped semiconductor material (e.g., undoped silicon, undoped polysilicon), at least one insulative material, or combinations thereof. In some embodiments, the first grains 168 and the second grains 170 comprise substantially the same material composition. In other embodiments, the first grains 168 and the second grains 170 comprise a different material composition.

In some embodiments, the first material 164 comprises one or both of tungsten and titanium and further comprises one or both of silicon and nitrogen, such as one or more of W, Ti, WN, TiN, WSi, TiSi, WSIN, and TiSiN.

In some embodiments, the first material 164 comprises one or more metals and one or more of boron, carbon, silicon, germanium, nitrogen, oxygen, phosphorus, and arsenic.

In some embodiments, the first material 164 comprises a semiconductive material, such as one or both of silicon and germanium. An atomic percent of silicon in the first material 164 may be within a range of from about 0 atomic percent to about 100 atomic percent, such as from about 0 atomic percent to about 1 atomic percent, from about 1 atomic percent to about 5 atomic percent, from about 5 atomic percent to about 10 atomic percent, from about 10 atomic percent to about 15 atomic percent, from about 15 atomic percent to about 20 atomic percent, from about 20 atomic percent to about 25 atomic percent, from about 25 atomic percent to about 30 atomic percent, from about 30 atomic percent to about 40 atomic percent, from about 40 atomic percent to about 60 atomic percent, from about 60 atomic percent to about 80 atomic percent, or from about 80 atomic percent to about 100 atomic percent silicon. In some embodiments, an atomic percent of silicon in the first material 164 is within a range of from about 10 atomic percent to about 30 atomic percent. In some embodiments, an atomic percent of silicon in the first material 164 is within a range of from about 10 atomic percent to about 40 atomic percent.

An atomic percentage of germanium in the first material 164 may be within a range of from about 0 atomic percent to about 100 atomic percent, such as from about 0 atomic percent to about 20 atomic percent, from about 20 atomic percent to about 40 atomic percent, from about 40 atomic percent to about 60 atomic percent, from about 60 atomic percent to about 65 atomic percent, from about 65 atomic percent to about 70 atomic percent, from about 70 atomic percent to about 75 atomic percent, from about 75 atomic percent to about 80 atomic percent, from about 80 atomic percent to about 85 atomic percent, from about 85 atomic percent to about 90 atomic percent, from about 90 atomic percent to about 95 atomic percent, from about 95 atomic percent to about 99 atomic percent, or from about 99 atomic percent to about 100 atomic percent. In some embodiments, an atomic percentage of germanium in the first material 164 is within a range of from about 70 atomic percent to about 90 atomic percent. In some embodiments, an atomic percent of germanium in the first material 164 is at least about 70 percent.

In some embodiments, the first material 164 comprises greater than about 60 atomic percent germanium, such as greater than about 60 atomic percent, greater than about 70 atomic percent, greater than about 75 atomic percent, or greater than about 80 atomic percent germanium. In some embodiments, a remaining portion of the first material 164 comprises silicon. In some embodiments, the first material 164 comprises from about 65 atomic percent to about 75 atomic percent germanium, and the remaining portion of the first material 164 comprises silicon.

In some embodiments, the first material 164 comprises one or more dopants, such as one or more of boron, phosphorus, and arsenic. In some embodiments, the first material 164 is doped with phosphorus. In other embodiments, the first material is doped with boron. In some embodiments, the first material 164 is undoped. In some embodiments, the first material 164 comprises silicon germanium (SiGe). In some embodiments, the first material 164 comprises silicon germanium doped with boron.

The first material 164 may be formed in a deposition chamber by one or more of ALD, CVD, plasma enhanced ALD, PVD (e.g., sputter deposition), PECVD, and LPCVD. In some embodiments, the first material 164 is formed by plasma enhanced ALD. In other embodiments, the first material 164 is formed by CVD.

In some embodiments, the first material 164 is formed by so-called "self-seeded deposition" (also referred to as "self-seeded growth"). A nucleation density (which may correspond to a density of the first grains 168 and the second grains 170) may be tailored to facilitate formation of the first grains 168 to span the width $W_2$ (FIG. 1E) of the slot 142. In some embodiments, the first grains 168 and the second grains 170 are formed simultaneously.

In some embodiments, the first material 164 is formed by exposing the surfaces of the slot 142 (e.g., the sidewalls 163 of the second insulative liner material 162) to a deposition composition. In some embodiments, the deposition composition comprises a silicon-containing precursor and a germanium-containing precursor. In some embodiments, the first material deposition composition further comprises a precursor for at least one dopant.

The silicon-containing precursor may comprise one or more of silane ($SiH_4$), disilane ($Si_2H_6$), dichlorosilane ($SiH_2Cl_2$) (DCS), trimethylsilane ($(CH_3)_3SiH$), tetramethylsilane ($(CH_3)_4Si$), and hexachlorodisilane ($(SiCl_3)_2$) (HCDS). In some embodiments, the silicon-containing precursor comprises silane.

The germanium-containing precursor may comprise one or more of germane ($GeH_4$), tetramethylgermanium ($(CH_3)_4Ge$), hexamethyldigermanium (IV) ($(CH_3)_6Ge_2$), tributylgermanium hydride ($[CH_3(CH_2)_3]_3GeH$), and tricthylgermanium hydride ($(C_2H_5)_3GeH$). In some embodiments, the germanium-containing precursor further comprises a carrier gas, such as hydrogen ($H_2$).

In some embodiments, the dopant comprises boron and the deposition composition comprises one or more boron-containing precursors, such as one or more of boron trichloride ($BCl_3$), diborane ($B_2H_6$), trimethyl borate ($C_3H_9BO_3$) (TMB), and triisopropyl borate ($[(CH_3)_2CHO]_3B$).

A flow rate of the germanium-containing precursor may be within a range of from about 30 volume percent to about 70 volume percent of the total flow rate of the deposition composition excluding carrier gases (e.g., nitrogen, argon), such as from about 30 volume percent to about 40 volume percent, from about 40 volume percent to about 50 volume percent, from about 50 volume percent to about 60 volume percent, or from about 60 volume percent to about 70 volume percent of the total flow rate of the deposition composition.

A flow rate of the silicon-containing precursor may be within a range of from about 30 volume percent to about 70 volume percent of the total flow rate of the deposition composition excluding carrier gases, such as from about 30 volume percent to about 40 volume percent, from about 40 volume percent to about 50 volume percent, from about 50 volume percent to about 60 volume percent, or from about 60 volume percent to about 70 volume percent of the total flow rate of the deposition composition.

A flow rate of a dopant-containing precursor may be within a range of from about 0 volume percent to about 10 volume percent of the total flow rate of the deposition composition excluding carrier gases, such as from about 0 volume percent to about 5 volume percent, or from about 5 volume percent to about 10 volume percent of the total flow rate of the deposition composition.

In some embodiments, a ratio of the germanium-containing precursor to the silicon-containing precursor in the deposition composition may be within a range of from about 0.5:1.0 to about 2.0:1.0, such as from about 0.5:1.0 to about 1.0:1.0, from about 1.0:1.0 to about 1.5:1.0, or from about 1.5:1.0 to about 2.0:1.0. In other words, in some such embodiments, the deposition composition may include from about 0.5 to about 2.0 molecules of the germanium-containing precursor for every about 1.0 molecule of the silicon-containing precursor.

A temperature of the deposition chamber may be within a range of from about 400° C. to about 600° C., such as from about 400° C. to about 425° C., from about 425° C. to about 450° C., from about 450° C. to about 475° C., from about 475° C. to about 500° C., from about 500° C. to about 550° C., or from about 550° C. to about 600° C. In some embodiments, the temperature of the deposition chamber is within a range of from about 450° C. to about 500° C.

In some embodiments, a pressure of the deposition chamber may be less than about 1.0 torr, such as less than about 0.5 torr. In some embodiments, a pressure of the deposition chamber may be about 0.35 torr.

In some embodiments, the deposition composition further comprises an etchant composition comprising one or more etchant gases. In some embodiments, the etchant composition includes a halogen-containing gas, such as fluorocarbon. By way of non-limiting example, the etchant composition may include one or more of hydrogen chloride (HCl), chlorine ($Cl_2$), hydrogen bromide (HBr), dichlorosilane, sulfur hexafluoride ($SF_6$), carbon tetrafluoride ($CF_4$), and trifluoromethane ($CHF_3$) (fluoroform).

In other embodiments, the deposition composition does not include the etchant composition and the deposition composition is cycled in the deposition chamber with the one or more etchants. In some such embodiments, the microelectronic device structure 100 is exposed to the deposition composition for a duration of time, a flow of the deposition composition is reduced (e.g., turned off), and a flow of the etchant composition is increased. After another duration, the flow of the etchant composition is decreased (e.g., turned off), and the flow of the deposition composition is resumed. The flow of the deposition composition and the flow of the etchant composition may be cycled a desired number of times to facilitate formation of the first material 164.

The one or more etchants of the etchant composition may be formulated and configured to facilitate a desired growth rate of the first grains 168 and the second grains 170 and a desired volume percent of the first grains 168 relative to the second grains 170. Without being bound by any particular theory, it is believed that by controlling the composition of the etchant composition and an amount of the etchant composition relative to the deposition composition, the nucleation density of the first material 164 is controlled. For example, the one or more etchants may substantially remove relatively smaller grains (e.g., the second grains 170) without substantially completely removing the first grains 168 since the first grains 168 are larger and would require a longer exposure to the one or more etchants of the etchant composition to be completely removed. The continued exposure of the microelectronic device structure 100 to the deposition composition facilitates continued growth of the first grains 168 while exposure to the one or more etchants may reduce a number of the second grains 170 that are grown from the sidewalls 163.

In some embodiments, the sidewalls 163 of the insulative liner material 165 are cleaned prior to forming the first grains 168 and the second grain 170 of the first material 164 thereon. In some embodiments, the sidewalls 163 are exposed to, for example, a cleaning chemistry, such as a wet etchant formulated and configured to increase a smoothness (e.g., decrease a roughness) of the sidewalls 163.

Figure 1G:
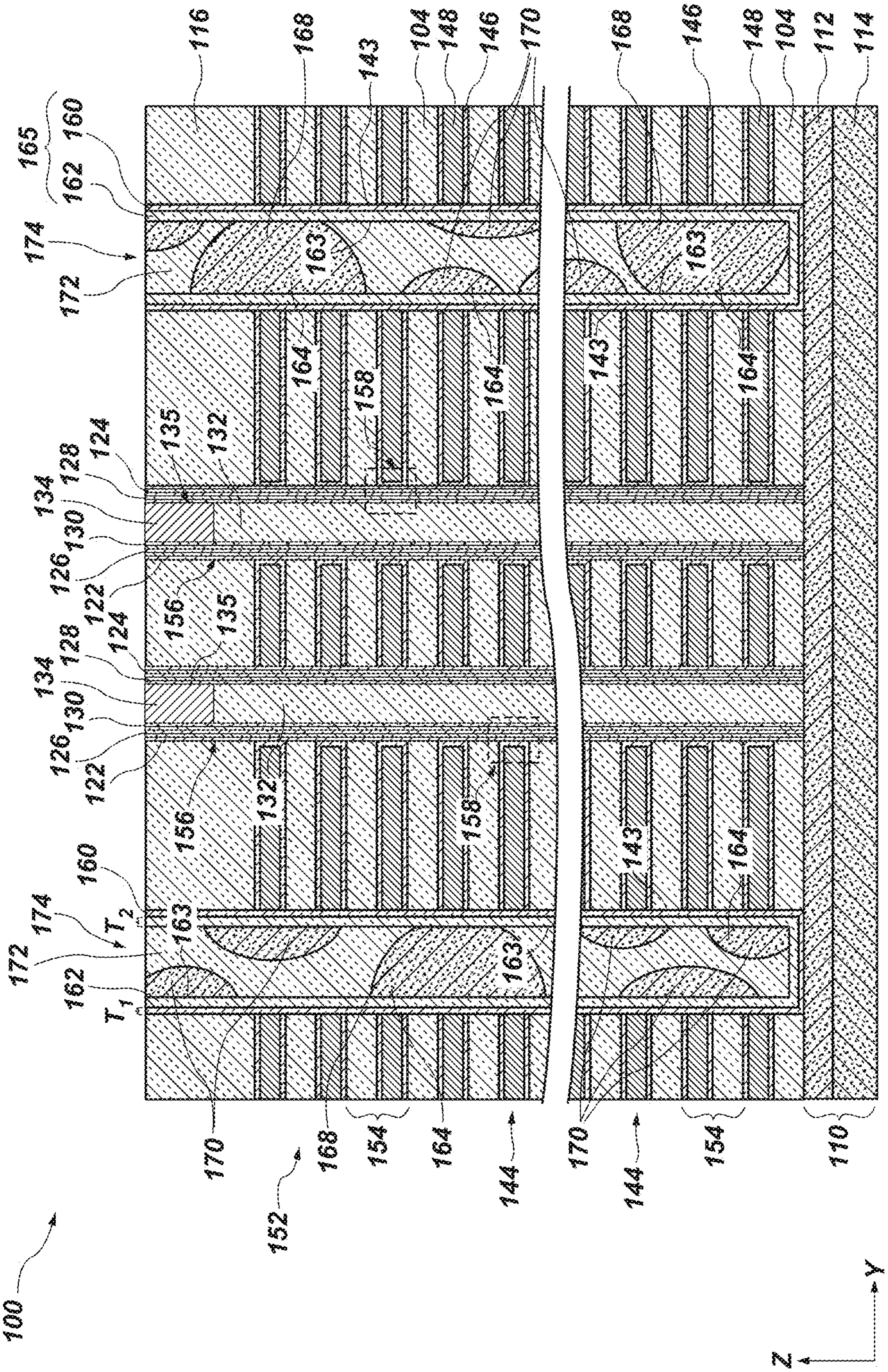
Figure 1H:
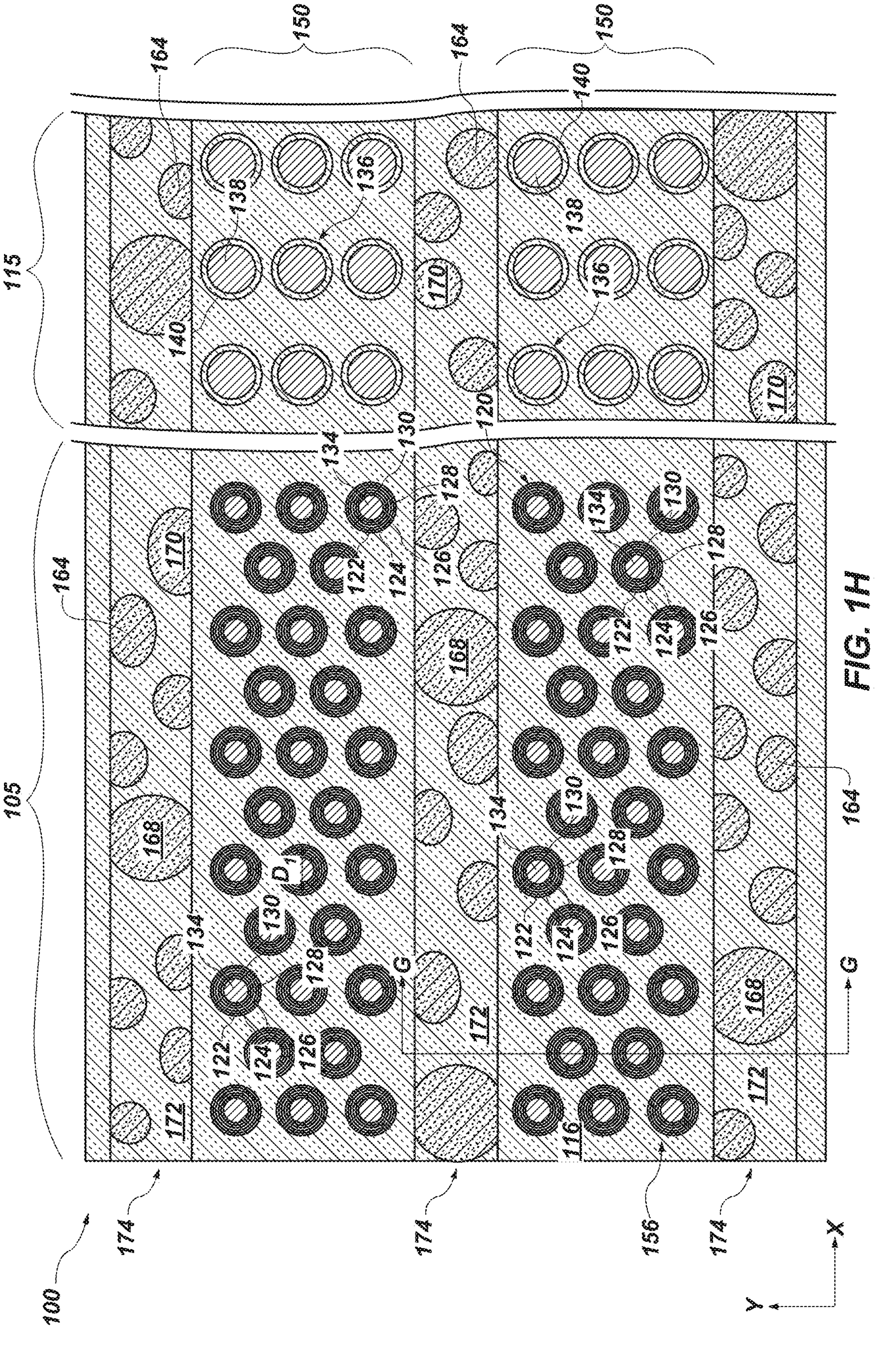

FIG. 1G is a simplified partial cross-sectional view of the microelectronic device structure 100 taken through section line G-G of FIG. 1H, which is a simplified partial top-down view of the microelectronic device structure 100. After forming the first material 164, a second material 172 may fill the unfilled portions 166 (FIG. 1F) of the slots 142 (FIG. 1F) to form slot structures 174. The slot structures 174 may be substantially filled with the second material 172 and the first material 164 comprising the first grains 168 and the second grains 170. In other embodiments, the slot structures 174 may not include the second material 172 and spaces between the first grains 168 and the second grains 170 may comprise voids. In other embodiments, at least some of each slot structure 174 includes voids between the first grains 168 and the second grains 170 while other portions of the slot structures 174 include the second material 172.

The second material 172 may be formed of and include one or more of insulative material, semiconductive material, and conductive material. In some embodiments, the second material 172 comprises insulative material, such as one or more of the materials described above with reference to the insulative structures 104 or the additional insulative structures 106 (FIG. 1A). In some embodiments, the second material 172 comprises silicon dioxide. In other embodiments, the second material 172 comprises semiconductive material, such as one or more of the materials described above with reference to the first material 164. In some such embodiments, the second material 172 may comprise silicon. In yet other embodiments, the second material 172 comprises conductive material, such as one or more of the materials described above with reference to the conductive material 148.

With continued reference to FIG. 1G and FIG. 1H, the first grains 168 may span substantially across an entire lateral (e.g., in the Y-direction) width of the slot structures 174. In some embodiments, a largest lateral (e.g., in the Y-direction) width of the first grains 168 may be substantially the same as the lateral (e.g., in the Y-direction) width of the second material 172. In some embodiments, the first grains 168 each individually contact a first sidewall 163 of the insulative liner material 165 and a second, opposing sidewall 163 of the insulative liner material 165.

Figure 2:
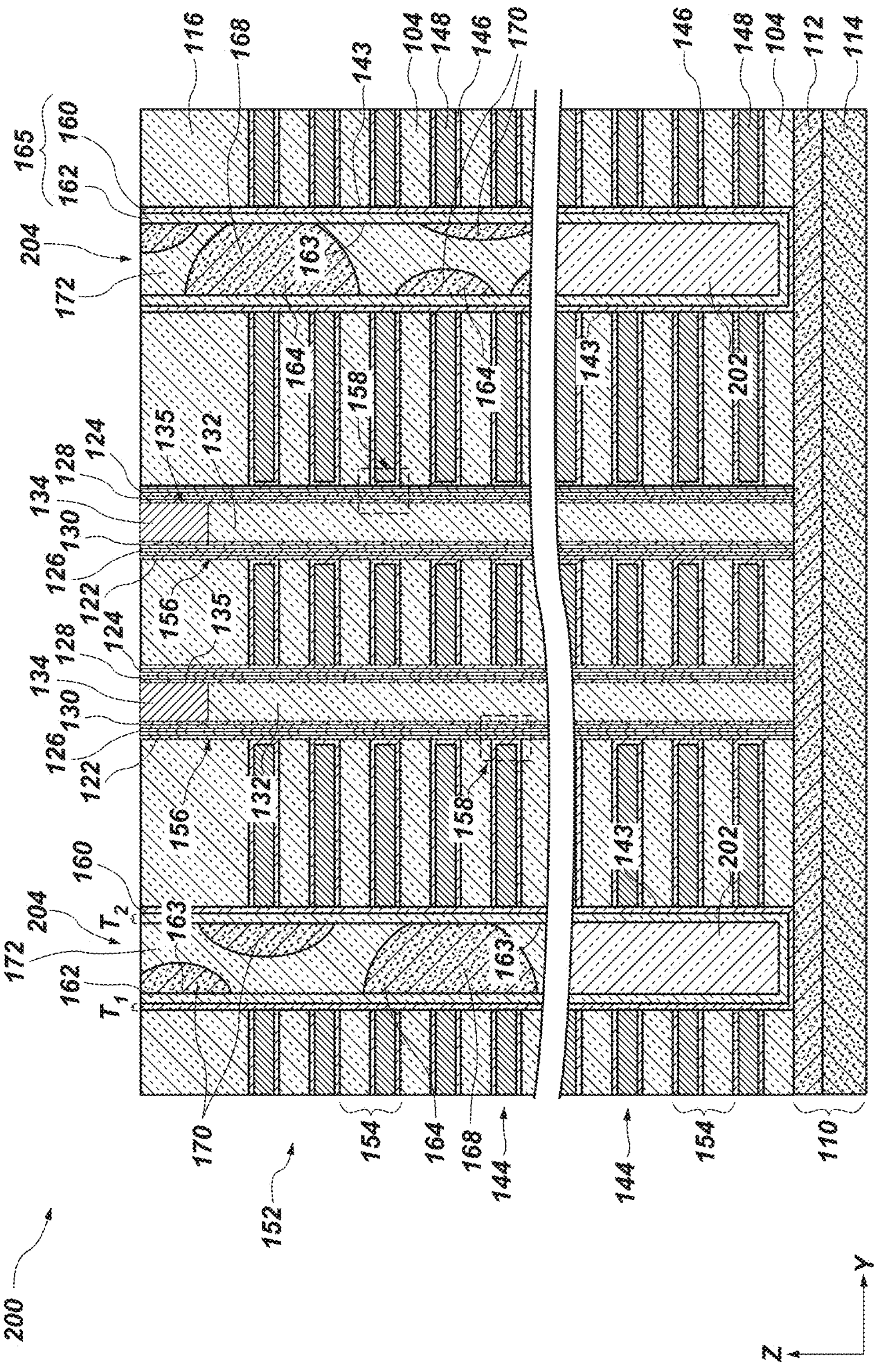
FIG. 2 is a simplified partial cross-sectional view of a microelectronic device structure, in accordance with embodiments of the disclosure.

Although FIG. 1G and FIG. 1H have been described and illustrated as comprising the first material 164 and the second material 172 vertically extending (e.g., in the Z-direction) through the entire slot structure 174, the disclosure is not so limited. FIG. 2 is a simplified partial cross-sectional view of a microelectronic device structure 200 substantially the same as the microelectronic device structure 100 of FIG. 1G and FIG. 1H and illustrating the same partial cross-sectional view as FIG. 1G, except that the microelectronic device structure 200 includes a slot structure 204 comprising a fill material 202 at vertically (e.g., in the Z-direction) lower portions of the slot structure 204 and comprises the first material 164 and the second material 172 vertically above the fill material 202.

In some embodiments, the microelectronic device structure 200 is formed by forming the fill material 202 in the slots 142 (FIG. 1E) prior to forming the first material 164 and the second material 172. After forming the fill material 202, the first material 164 and the second material 172 are formed within the slots 142 to form the slot structures 204.

The fill material 202 may be formed of and include insulative material, such as one or more of the materials described above with reference to the insulative structures 104 or one or more of the materials described above with reference to the additional insulative structures 106 (FIG. 1A). In some embodiments, the fill material 202 comprises substantially the same material composition as the insulative structures 104. In some embodiments, the fill material 202 comprises silicon dioxide. In other embodiments, fill material 202 comprises a semiconductive material, such as one or more of III-V semiconductors (e.g., InGaAl, SbAsPN, one or more of silicon, germanium, gallium, indium, conductive-doped silicon, conductively-doped germanium, conductively-doped gallium, and conductively-doped indium).

Although the first material 164 has been described as being formed by deposition (e.g., plasma enhanced ALD), the disclosure is not so limited. In other embodiments, the first grains 168 and the second grains 170 are formed by introducing a slurry into the slots 142 (FIG. 1E). The slurry comprises particles from which the first material 164 is formed dispersed in a solvent. The particles of the slurry exhibit a desired size distribution corresponding to the size distribution of the first grains 168 and the second grains 170. After introducing the slurry to the slots 142, the solvent is evaporated, leaving the particles of the first material 164 within the slots 142. After evaporating the solvent, the second material 172 may be formed on the first material 164 to and substantially fill the slots 142 to form the slot structures 174.

In some embodiments, forming the first grains 168 to have a dimension that spans substantially the entire width $W_2$ (FIG. 1E) of the slots 142 (FIG. 1E) facilitates formation of the microelectronic device structure 100, 200 having improved properties compared to conventional microelectronic device structures. Without being bound by any particular theory, it is believed that forming the first grains 168 to span the entire width $W_2$ and forming the second grains 170 to span less than the width $W_2$ (e.g., less than half of the width $W_2$) reduces the number of interfaces between different materials in the slot structures 174 (FIG. 1G), 204 (FIG. 2), such as interfaces between the first grains 168 and other first grains 168, interfaces between the first grains 168 and the second grains 170, interfaces between the first grains 168 and the second material 172, interfaces between the second grains 170 and other second grains 170, and interfaces between the second grains 170 and the second material 172. Reducing the number of interfaces in laterally central (e.g., in the Y-direction) portions of the slot structure 174, 204 increases the strength of the microelectronic device structure 100, 200 since the interfaces create relatively weak portions where the microelectronic device structure 100, 200 may be prone to bending or breaking. In other words, the size of the first grains 168 spanning the width $W_2$ of the slots 142 facilitates a reduction in the tendency of the microelectronic device structure 100, 200 to bend or break. In addition, the large size of the first grains 168 may redistribute forces along interior sidewalls (e.g., sidewalls 163) of the insulative liner material 165 of the slot 142 to reduce collapse of the resulting slot structures 174, 204.

In some embodiments, at least a portion of the dielectric material 116 overlying the stair step structure 125 (FIG. 1A) is formed of and includes the first material 164 comprising the first grains 168 and the second grains 170. In other words, in some such embodiments, at least a portion of the dielectric material 116 overlying the stair step structure 125 comprises the first grains 168 and second grains 170, the first grains 168 having a larger dimension than the second grains 170.

Figure 3:
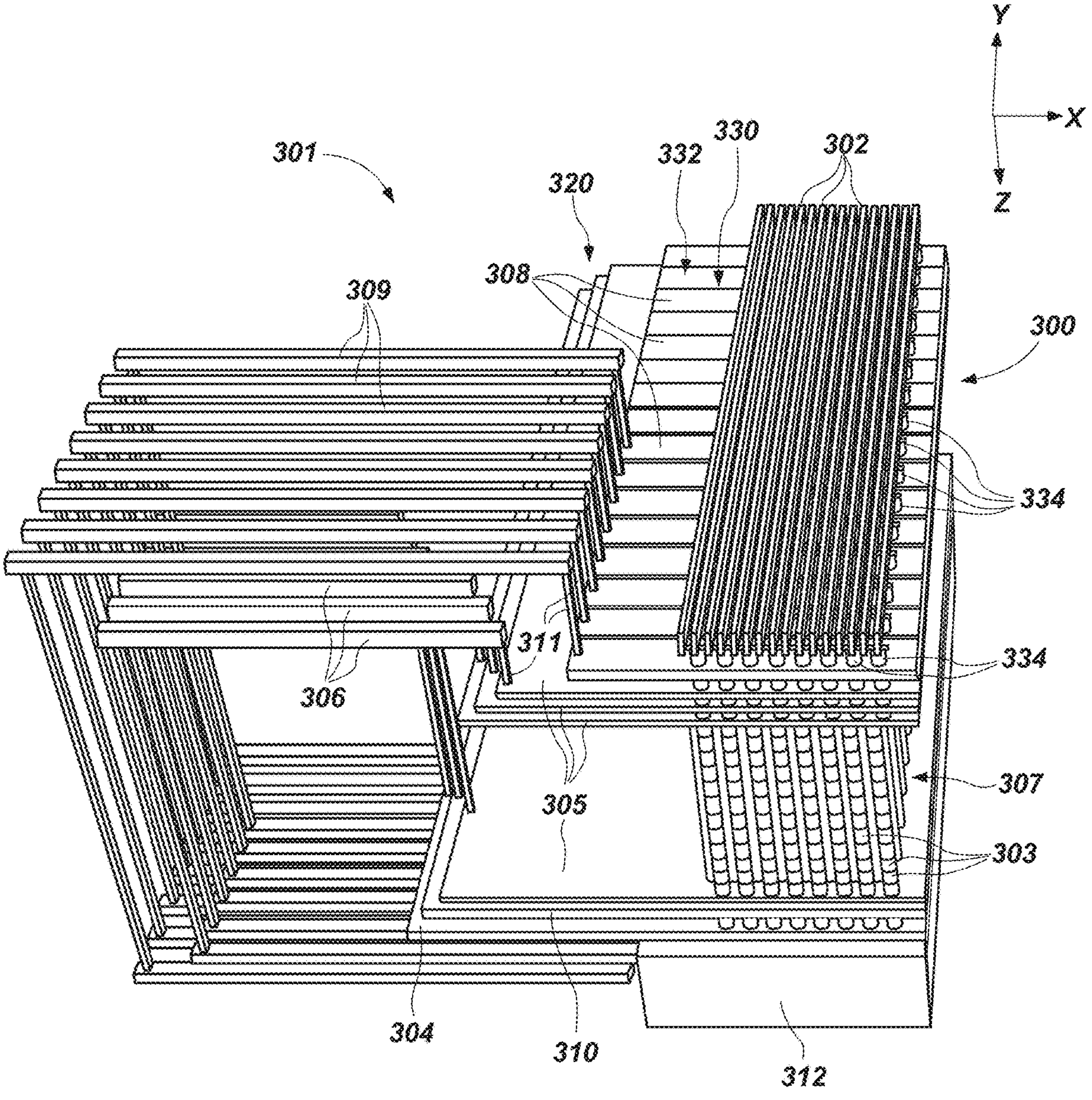
FIG. 3 is a partial cutaway perspective view of a microelectronic device, in accordance with embodiments of the disclosure.

FIG. 3 illustrates a partial cutaway perspective view of a portion of a microelectronic device 301 (e.g., a memory device, such as a dual-deck 3D NAND Flash memory device) including a microelectronic device structure 300. The microelectronic device structure 300 may be substantially similar to the microelectronic device structures 100, 200 following the processing stages previously described with reference to FIG. 1G, FIG. 1H, and FIG. 2. As shown in FIG. 3, the microelectronic device structure 300 may include a staircase structure 320 (e.g., stair step structure 125 (FIG. 1A)) defining contact regions for connecting access lines 306 to conductive tiers 305 (e.g., conductive layers, conductive plates, such as the conductive structures 144

(FIG. 1G)). The microelectronic device structure 300 may include vertical strings 307 (e.g., strings 156 (FIG. 1G, FIG. 2)) of memory cells 303 (e.g., memory cells 158 (FIG. 1G, FIG. 2)) that are coupled to each other in series. The vertical strings 307 may extend vertically (e.g., in the Z-direction) and orthogonally to conductive lines and tiers 305, such as data lines 302 (e.g., bit lines), a source tier 304 (e.g., the source tier 110 (FIG. 1G, FIG. 2)), the conductive tiers 305, the access lines 306, first select gates 308 (e.g., upper select gates, drain select gates (SGDs), such as upper ones of the conductive structures 144), select lines 309, and a second select gate 310 (e.g., a lower select gate, a source select gate (SGS), such as lower ones of the conductive structures 144). The first select gates 308 may be horizontally divided (e.g., in the Y-direction) into multiple block structures 332 (e.g., block structures 150 (FIG. 1H)) and sub-blocks horizontally separated (e.g., in the Y-direction) from one another by slot structures 330 (e.g., slot structures 174 (FIG. 1G, FIG. 1H), slot structures 204 (FIG. 2)).

The data lines 302 may be electrically coupled to the vertical strings 307 through conductive contact structures 334.

Vertical conductive contacts 311 may electrically couple components to each other as shown. For example, the select lines 309 may be electrically coupled to the first select gates 308 and the access lines 306 may be electrically coupled to the conductive tiers 305. The microelectronic device 301 may also include a control unit 312 positioned under the memory array, which may include control logic devices configured to control various operations of other features (e.g., the vertical strings 307 of memory cells 303) of the microelectronic device 301. By way of non-limiting example, the control unit 312 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 312 may be electrically coupled to the data lines 302, the source tier 304, the access lines 306, the first select gates 308, and the second select gates 310, for example. In some embodiments, the control unit 312 includes CMOS (complementary metal-oxide-semiconductor) circuitry. In such embodiments, the control unit 312 may be characterized as having a "CMOS under Array" ("CuA") configuration.

The first select gates 308 may extend horizontally in a first direction (e.g., the X-direction) and may be coupled to respective first groups of vertical strings 307 of memory cells 303 at a first end (e.g., an upper end) of the vertical strings 307. The second select gate 310 may be formed in a substantially planar configuration and may be coupled to the vertical strings 307 at a second, opposite end (e.g., a lower end) of the vertical strings 307 of memory cells 303.

The data lines 302 (e.g., bit lines) may extend horizontally in a second direction (e.g., in the Y-direction) that is at an angle (e.g., perpendicular) to the first direction in which the first select gates 308 extend. The data lines 302 may be coupled to respective second groups of the vertical strings 307 at the first end (e.g., the upper end) of the vertical strings 307. A first group of vertical strings 307 coupled to a respective first select gate 308 may share a particular vertical string 307 with a second group of vertical strings 307 coupled to a respective data line 302. Thus, a particular vertical string 307 may be selected at an intersection of a particular first select gate 308 and a particular data line 302. Accordingly, the first select gates 308 may be used for selecting memory cells 303 of the vertical strings 307 of memory cells 303.

The conductive tiers 305 may extend in respective horizontal planes. The conductive tiers 305 may be stacked vertically, such that each conductive tier 305 is coupled to all of the vertical strings 307 of memory cells 303, and the vertical strings 307 of the memory cells 303 extend vertically through the stack of conductive tiers 305. The conductive tiers 305 may be coupled to or may form control gates of the memory cells 303 to which the conductive tiers 305 are coupled. Each conductive tier 305 may be coupled to one memory cell 303 of a particular vertical string 307 of memory cells 303.

The first select gates 308 and the second select gates 310 may operate to select a particular vertical string 307 of the memory cells 303 between a particular data line 302 and the source tier 304. Thus, a particular memory cell 303 may be selected and electrically coupled to a data line 302 by operation of (e.g., by selecting) the appropriate first select gate 308, second select gate 310, and conductive tier 305 that are coupled to the particular memory cell 303.

The staircase structure 320 may be configured to provide electrical connection between the access lines 306 and the conductive tiers 305 through the vertical conductive contacts 311. In other words, a particular level of the conductive tiers 305 may be selected via an access line 306 in electrical communication with a respective vertical conductive contact 311 in electrical communication with the particular conductive tier 305.

Thus, in accordance with some embodiments of the disclosure, a microelectronic device comprises a stack structure, and slot structures vertically extending through the stack structure and dividing the stack structure into block structures. Each of the slot structures individually comprises an insulative liner material vertically extending through the slot structure and contacting sidewalls of the insulative levels and the conductive levels defining the slot structure, and grains of a material in contact with sidewalls of the insulative liner material. The grains of the material comprise first grains spanning an entire width between the sidewalls of the insulative liner material.

Furthermore, in accordance with further embodiments of the disclosure, a memory device comprises a stack structure comprising alternating conductive structures and insulative structures arranged in tiers, each of the tiers individually comprising a conductive structure and an insulative structure, strings of memory cells vertically extending through the stack structure, the strings of memory cells comprising a channel material vertically extending through the stack structure, and a slot structure vertically extending through the stack structure to a source tier vertically underlying the stack structure. The slot structure comprises a first insulative liner material in contact with sidewalls of the alternating conductive structures and insulative structures defining the slot structure, a second insulative liner material in contact with the first insulative liner material, and a first material contacting sidewalls of the second insulative liner material, at least some of the first material comprising grains extending from a first sidewall of the second insulative liner material to a second, opposing sidewall of the second insulative liner material.

In accordance with additional embodiments, a method of forming a microelectronic device comprises forming pillars comprising a channel material in an array region of a stack structure comprising a vertically alternating sequence of insulative structures and additional insulative structures, forming slots vertically extending through the stack structure, removing the additional insulative structures through the slots, forming conductive structures vertically between pairs of the insulative structures vertically neighboring one another after removing the additional insulative structures through the slots, forming an insulative liner material on sidewalls defining the slots, and forming grains of a first material on sidewalls of the insulative liner material, the grains of the first material laterally extending from a first sidewall of the insulative liner material to a second, opposing sidewall of the insulative liner material.

Figure 4:
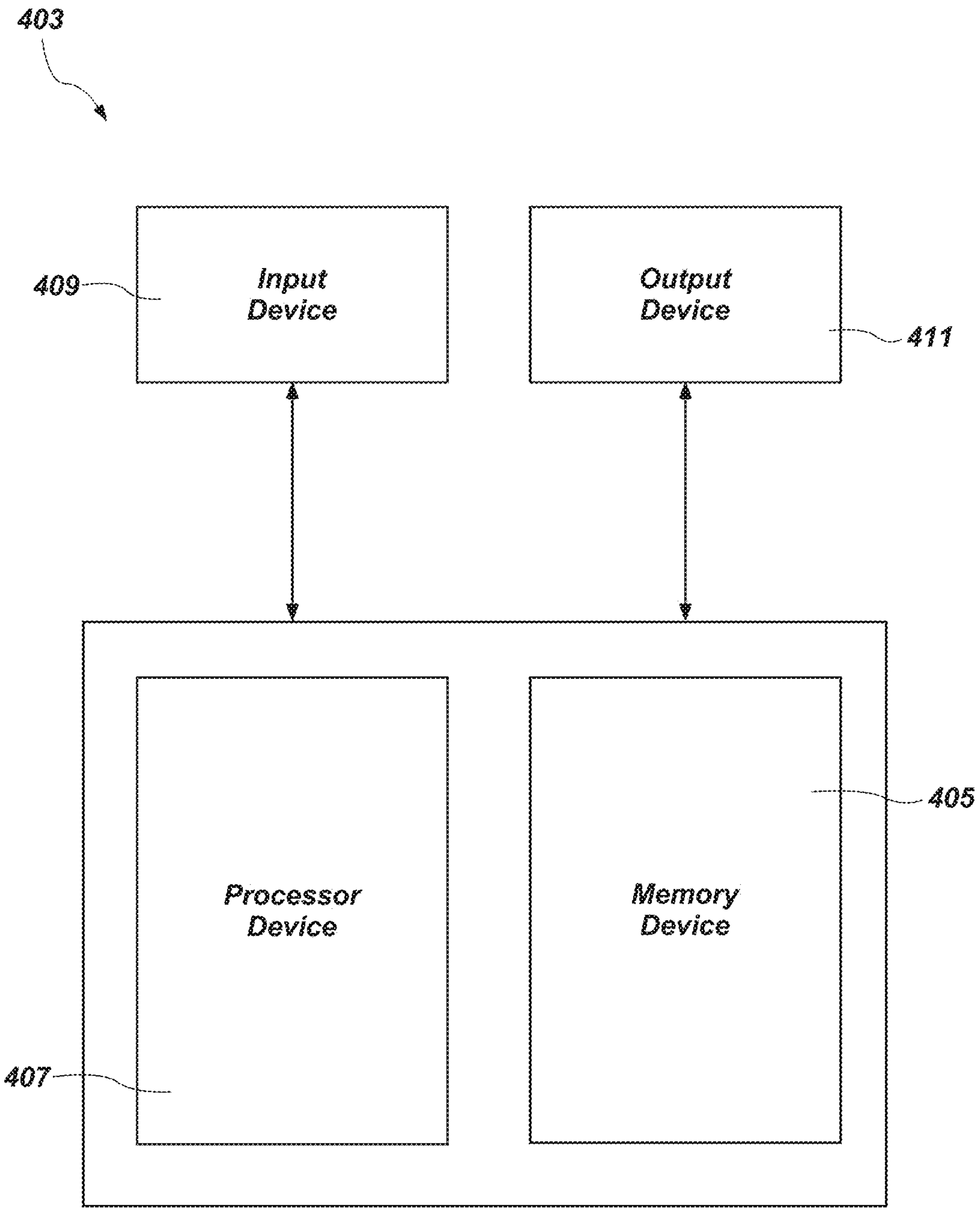
FIG. 4 is a block diagram of an electronic system, in accordance with embodiments of the disclosure.

Microelectronic devices (e.g., the microelectronic device 301 including microelectronic device structures (e.g., the microelectronic device structures 100, 200, 300)) of the disclosure may be included in embodiments of electronic systems of the disclosure. For example, FIG. 4 is a block diagram of an electronic system 403, in accordance with embodiments of the disclosure. The electronic system 403 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 403 includes at least one memory device 405. The memory device 405 may include, for example, an embodiment of a microelectronic device structure previously described herein (e.g., the microelectronic device structure 100, 200, 300 previously described with reference to FIG. 1A through FIG. 1H, FIG. 2, and FIG. 3) or a microelectronic device (e.g., the microelectronic device 301) previously described with reference to FIG. 3.

The electronic system 403 may further include at least one electronic signal processor device 407 (often referred to as a "microprocessor"). The electronic signal processor device 407 may, optionally, include an embodiment of one or more of a microelectronic device and a microelectronic device structure previously described herein. The electronic system 403 may further include one or more input devices 409 for inputting information into the electronic system 403 by a user, such as, for example, a mouse or other pointing device, a keyboard, a touchpad, a button, or a control panel. The electronic system 403 may further include one or more output devices 411 for outputting information (e.g., visual or audio output) to a user such as, for example, a monitor, a display, a printer, an audio output jack, a speaker, etc. In some embodiments, the input device 409 and the output device 411 may comprise a single touchscreen device that can be used both to input information to the electronic system 403 and to output visual information to a user. The input device 409 and the output device 411 may communicate electrically with one or more of the memory device 405 and the electronic signal processor device 407.

Figure 5:
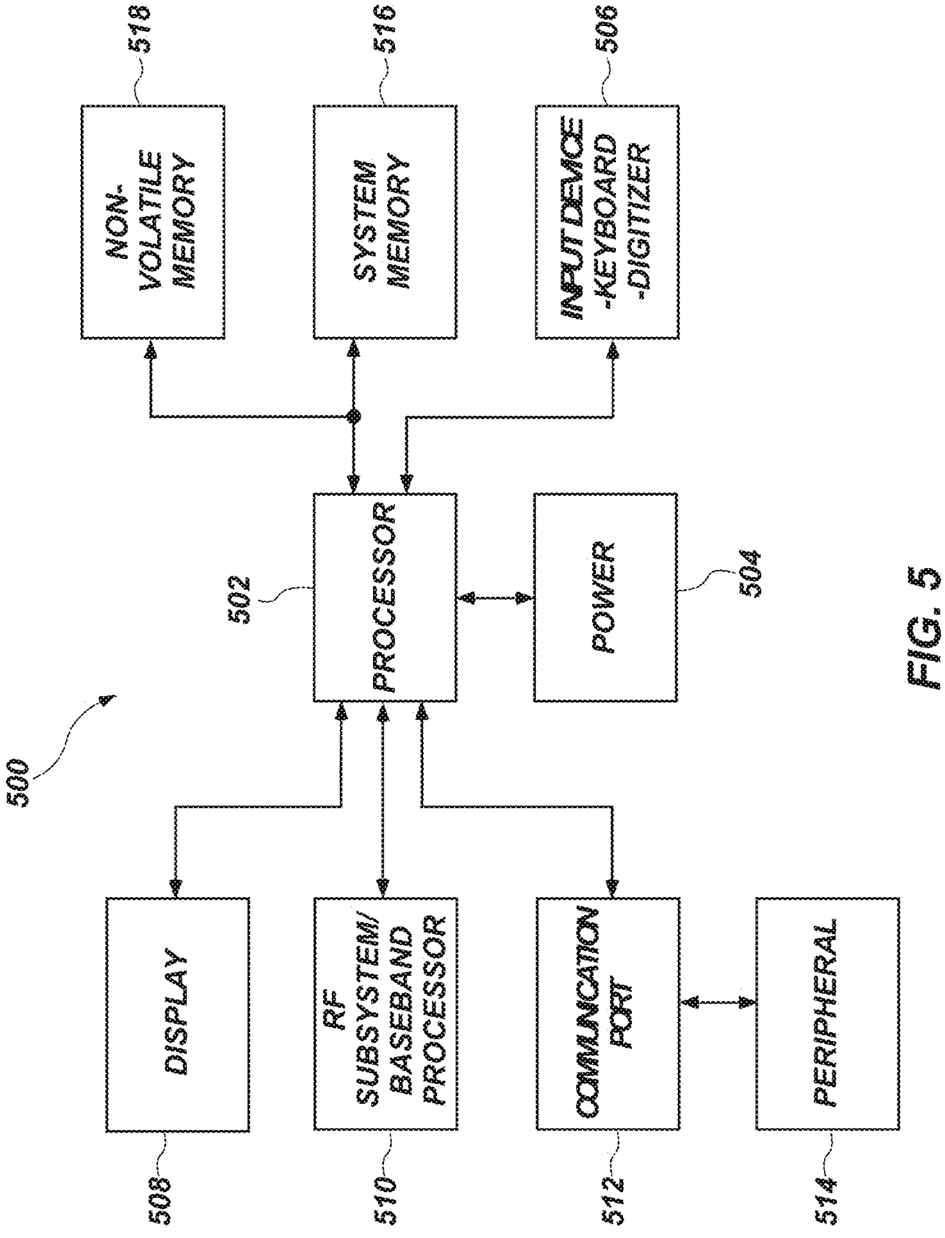
FIG. 5 is a block diagram of a processor-based system, in accordance with embodiments of the disclosure.

With reference to FIG. 5, depicted is a processor-based system 500. The processor-based system 500 may include one or more of a microelectronic device and a microelectronic device structure previously described herein and manufactured in accordance with embodiments of the disclosure. The processor-based system 500 may be any of a variety of types such as a computer, pager, cellular phone, personal organizer, control circuit, or other electronic device. The processor-based system 500 may include one or more processors 502, such as a microprocessor, to control the processing of system functions and requests in the processor-based system 500. The processor 502 and other subcomponents of the processor-based system 500 may include one or more of a microelectronic device and a microelectronic device structure previously described herein and manufactured in accordance with embodiments of the present disclosure.

The processor-based system 500 may include a power supply 504 in operable communication with the processor 502. For example, if the processor-based system 500 is a portable system, the power supply 504 may include one or more of a fuel cell, a power scavenging device, permanent batteries, replaceable batteries, and rechargeable batteries. The power supply 504 may also include an AC adapter; therefore, the processor-based system 500 may be plugged into a wall outlet, for example. The power supply 504 may also include a DC adapter such that the processor-based system 500 may be plugged into a vehicle cigarette lighter or a vehicle power port, for example.

Various other devices may be coupled to the processor 502 depending on the functions that the processor-based system 500 performs. For example, a user interface 506 may be coupled to the processor 502. The user interface 506 may include input devices such as buttons, switches, a keyboard, a light pen, a mouse, a digitizer and stylus, a touch screen, a voice recognition system, a microphone, or a combination thereof. A display 508 may also be coupled to the processor 502. The display 508 may include an LCD display, an SED display, a CRT display, a DLP display, a plasma display, an OLED display, an LED display, a three-dimensional projection, an audio display, or a combination thereof. Furthermore, an RF sub-system/baseband processor 510 may also be coupled to the processor 502. The RF sub-system/baseband processor 510 may include an antenna that is coupled to an RF receiver and to an RF transmitter (not shown). A communication port 512, or more than one communication port 512, may also be coupled to the processor 502. The communication port 512 may be adapted to be coupled to one or more peripheral devices 514, such as a modem, a printer, a computer, a scanner, or a camera, or to a network, such as a local area network, remote area network, intranet, or the Internet, for example.

The processor 502 may control the processor-based system 500 by implementing software programs stored in the memory. The software programs may include an operating system, database software, drafting software, word processing software, media editing software, or media playing software, for example. The memory is operably coupled to the processor 502 to store and facilitate execution of various programs. For example, the processor 502 may be coupled to system memory 516, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 516 may include volatile memory, non-volatile memory, or a combination thereof. The system memory 516 is typically large so that it can store dynamically loaded applications and data. In some embodiments, the system memory 516 may include semiconductor devices, such as one or more of a microelectronic devices and a microelectronic device structure previously described herein.

The processor 502 may also be coupled to non-volatile memory 518, which is not to suggest that system memory 516 is necessarily volatile. The non-volatile memory 518 may include one or more of STT-MRAM, MRAM, read-only memory (ROM) such as an EPROM, resistive read-only memory (RROM), and flash memory to be used in conjunction with the system memory 516. The size of the non-volatile memory 518 is typically selected to be just large enough to store any necessary operating system, application programs, and fixed data. Additionally, the non-volatile memory 518 may include a high-capacity memory such as disk drive memory, such as a hybrid-drive including resistive memory or other types of non-volatile solid-state memory, for example. The non-volatile memory 518 may include microelectronic devices, such as one or more of a microelectronic device and a microelectronic device structure previously described herein.

Accordingly, in at least some embodiments, an electronic device comprises an input device, an output device, a processor device operably coupled to the input device and the output device, and a memory device operably coupled to the processor device and comprising at least one microelectronic device structure. The at least one microelectronic device structure comprises strings of memory cells vertically extending through a stack structure comprising a vertically alternating sequence of insulative structures and conductive structures, at least one slot structure vertically extending through the stack structure and separating the stack structure into block structures, each block structure comprising some of the strings of memory cells, and individual grains of a semiconductive material extending from a sidewall of an insulative liner material of the at least one slot structure to an opposite sidewall of the insulative liner material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A memory device, comprising:
- blocks horizontally extending in parallel in a first direction, the blocks individually comprising tiers respectively including conductive material and insulative material vertically neighboring the conductive material;
- strings of memory cells vertically extending through the blocks; and
- slot structures horizontally alternating with the blocks in a second direction orthogonal to the first direction, the slot structures respectively comprising:
  - insulative liner material including:
    - two side portions substantially covering opposing sidewalls of two of the blocks; and
    - a lower portion horizontally extending in the second direction from and between the two side portions; and
  - semiconductive granules respectively horizontally extending, in the second direction, from and between opposing portions of the insulative liner material.

2. The memory device of claim 1, wherein the semiconductive granules of respective ones of the slot structures comprise:
- a semiconductive granule at a vertical position; and
- an additional semiconductive granule at an additional vertical position offset from the vertical position.

3. The memory device of claim 1, wherein, for respective ones of the slot structures, different ones of the semiconductive granules thereof have different magnitudes of surface area contact with the opposing portions of the insulative liner material than one another.

4. The memory device of claim 1, wherein, for at least one of the slot structures, at least one of the semiconductive granules thereof physically contacts each of the two side portions and the lower portion of the insulative liner material thereof.

5. The memory device of claim 1, wherein, for respective ones of the slot structures, at least one of the semiconductive granules thereof has a different volume than at least one other of the semiconductive granules thereof.

6. The memory device of claim 1, wherein the semiconductive granules comprise one or more of Si and Ge.

7. The memory device of claim 6, wherein the semiconductive granules respectively comprise:
- at least 10 atomic percent Si; and
- at least 65 atomic percent Ge.

8. The memory device of claim 1, wherein the semiconductive granules are respectively doped with one or more of B, P, and As.

9. The memory device of claim 1, wherein the slot structures respectively further comprise additional semiconductive granules respectively in physical contact with only one of the opposing portions of the insulative liner material.

10. A non-volatile memory device, comprising:
- two blocks respectively having non-volatile memory cells within a horizontal area thereof; and
- a slot structure horizontally interposed between the two blocks and comprising:
  - insulative liner material comprising:
    - a first side portion substantially covering a side of one of the two blocks;
    - a second side portion substantially covering a side of an other one of the two blocks; and
    - a bottom portion horizontally extending from the first side portion to the second side portion;
  - insulative fill material on and partially covering the first side portion, the second side portion, and the bottom portion of the insulative liner material; and
  - non-insulative granules respectively embedded within the insulative fill material, one or more of the non-insulative granules individually in physical contact with each of the first side portion and the second side portion of the insulative liner material.

11. The non-volatile memory device of claim 10, wherein one or more other of the non-insulative granules are individually in physical contact with one of the first side portion and the second side portion of the insulative liner material but not an other of the first side portion and the second side portion of the insulative liner material.

12. The non-volatile memory device of claim 11, wherein the one or more of the non-insulative granules constitute from about 5 percent to about 10 percent of a total quantity of the non-insulative granules.

13. The non-volatile memory device of claim 10, wherein the non-insulative granules respectively comprise one or more of conductive material and semiconductive material.

14. The non-volatile memory device of claim 13, wherein: the conductive material comprises one or more of W, Ti, WN, TiN, WSi, TiSi, WSiN, and TiSiN; and the semiconductive material comprises one or more of Si and Ge.

15. A 3D NAND Flash memory device, comprising:
blocks respectively comprising a vertically alternating sequence of conductive material and insulative material;
vertically extending strings of memory cells within the blocks; and
slot structures horizontally alternating with the blocks and respectively comprising:
insulative liner material substantially covering opposing sidewalls of a pair of the blocks horizontally neighboring one another;
insulative fill material on opposing inner side surfaces and an inner bottom surface of the insulative liner material; and
grains of non-insulative material embedded in the insulative fill material and respectively horizontally extending from and between the opposing inner side surfaces of the insulative liner material.

16. The 3D NAND Flash memory device of claim 15, further comprising an additional insulative liner material horizontally interposed between the insulative liner material and the opposing sidewalls of the pair of the blocks, the additional insulative liner material having a different material composition than the insulative liner material.

17. The 3D NAND Flash memory device of claim 15, wherein, for respective ones of the slot structures, one or more of the grains of non-insulative material physically contact the inner bottom surface of the insulative liner material.

18. The 3D NAND Flash memory device of claim 15, wherein, for respective ones of the slot structures, the grains of non-insulative material comprise grains of semiconductive material individually including one or more of Si and Ge.

19. The 3D NAND Flash memory device of claim 15, wherein, for respective ones of the slot structures, the grains of non-insulative material have a mean grain maximum dimension within a range of from about 200 nm to about 300 nm.

* * * * *